United States Patent
Okubo et al.

(10) Patent No.: US 7,714,648 B2
(45) Date of Patent: May 11, 2010

(54) AMPLIFYING SYSTEM

(75) Inventors: Yoichi Okubo, Kodaira (JP); Toshio Nojima, Sapporo (JP); Yasuhiro Takeda, Kodaira (JP); Manabu Nakamura, Kodaira (JP); Masaru Adachi, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 187 days.

(21) Appl. No.: 11/920,629

(22) PCT Filed: May 17, 2006

(86) PCT No.: PCT/JP2006/310285

§ 371 (c)(1),
(2), (4) Date: Dec. 14, 2007

(87) PCT Pub. No.: WO2006/126559

PCT Pub. Date: Nov. 30, 2006

(65) Prior Publication Data

US 2009/0051438 A1 Feb. 26, 2009

(30) Foreign Application Priority Data

May 23, 2005 (JP) .............................. 2005-149206
Mar. 17, 2006 (JP) .............................. 2006-074509

(51) Int. Cl.
*H03F 3/68* (2006.01)
(52) U.S. Cl. .................... 330/124 R; 330/295
(58) Field of Classification Search ............. 330/124 R, 330/286, 295
See application file for complete search history.

(56) References Cited

U.S. PATENT DOCUMENTS 6,617,929 B2 * 9/2003 Kim et al. .................. 330/295

(Continued)

FOREIGN PATENT DOCUMENTS

JP 2003-188651 7/2003

(Continued)

OTHER PUBLICATIONS

International Search Report issued Sep. 5, 2006 in the International (PCT) Application of which the present application is the U.S. National Stage.

(Continued)

*Primary Examiner*—Khanh V Nguyen
(74) *Attorney, Agent, or Firm*—Wenderoth, Lind & Ponack, L.L.P.

(57) ABSTRACT

The performance of an amplifying system is improved by achieving adequate matching. The amplifying system for amplifying signals includes distributing means 1 that distribute a signal, a carrier amplifier 2 that amplifies the distributed first signal in Class AB, a peak amplifier 4 that amplifies the distributed second signal in Class B or Class C, a first transmission line having a given electric length and being connected to an output of the carrier amplifier, a second transmission line having a given electric length and being connected to an output of the peak amplifier, and a combining end 18 for combining an output of the first transmission line and an output of the second transmission line. An impedance of the combining end is differentiated from a parallel impedance of load impedances of the carrier amplifier and the peak amplifier at the maximum power converted respectively by the first transmission line and the second transmission line, or is set as a parallel impedance in which the load impedances of the carrier amplifier and the peak amplifier at the maximum power are changed.

3 Claims, 15 Drawing Sheets

U.S. PATENT DOCUMENTS

| | | | |
|---|---|---|---|
| 7,342,444 B2 * | 3/2008 | Kim et al. | 330/124 R |
| 2004/0056723 A1 | 3/2004 | Gotou | |
| 2006/0097783 A1 | 5/2006 | Okubo et al. | |

FOREIGN PATENT DOCUMENTS

| | | |
|---|---|---|
| JP | 2004-120086 | 4/2004 |
| JP | 2006-157900 | 6/2006 |

OTHER PUBLICATIONS

Tetsuji Harada, et al., "*Consideration of Peaking Amplifier Output Circuit in Doherty Amplifier*", 2003 Nen The Institute of Electronics, Information and Communication Engineers Electronics Society Taikai Koen Ronbunshu, C-2-34, Sep. 10, 2003.

\* cited by examiner

AMPLIFYING SYSTEM

TECHNICAL FIELD

The present invention relates to a Doherty-type amplifying system and, more specifically, to an amplifying system having an improved performance by adequate matching.

BACKGROUND ART

For example, in the case of power amplification of radio-frequency signals such as CDMA (Code Division Multiple Access) signals or multi-carrier signals, reduction of power consumption is achieved by adding a distortion compensation function to a common amplifier and widening the operating range of the common amplifier to an area near a saturation range. The method of distortion compensation includes a feed forward distortion compensation approach or a pre-distortion distortion compensation approach. However, the reduction of power consumption only with the distortion compensation is already near the limit. Therefore, a Doherty amplifier nowadays attracts attention as a high-efficiency amplifier.

FIG. 8 illustrates an example of configuration of the Doherty amplifier.

A signal entering through an input terminal A21 is distributed by a distributor 41.

A part of the distributed signal is supplied to a carrier amplifier 42. The carrier amplifier 42 includes an amplifying element 52, an input matching circuit 51 adapted to achieve matching to an input side of the amplifying element 52 and an output matching circuit 53 adapted to achieve matching to an output side of the amplifying element 52. Impedance conversion is applied to an output from the carrier amplifier 42 by a λ/4 transformer 57.

The other part of the distributed signal is delayed in phase by 90° by a phase shifter 43 and is supplied to a peak amplifier 44. The peak amplifier 44 includes an input matching circuit 54, an amplifying element 55 and an output matching circuit 56 like the carrier amplifier 42.

An output from the λ/4 transformer 57 and an output from the peak amplifier 44 are combined at a node (combining point) 58. The combined signal is applied with the impedance conversion by a λ/4 transformer 46 for achieving matching to Z0, which is an output load 47.

An output from the λ/4 transformer 46 is connected to the output load 47 via an output terminal A22.

A combination of the λ/4 transformer 57 and the node 58 is referred to as Doherty composition 45.

The carrier amplifier 42 and the peak amplifier 44 are different such that the amplifying element 52 of the carrier amplifier 42 is biased to Class AB and the amplifying element 55 of the peak amplifier 44 is biased to Class B or Class C. Therefore, the amplifying element 52 of the carrier amplifier 42 operates independently to an input level at which the amplifying element 55 of the peak amplifier 44 operates and, when the amplifying element 52 of the carrier amplifier 42 reaches the saturation range, that is, when linearity of the amplifying element 52 starts to be turbulent, the amplifying element 55 of the peak amplifier 44 starts to operate to supply the output of the amplifying element 55 to a load so as to drive the load together with the amplifying element 52 of the carrier amplifier 42. Load resistance of the output matching circuit 53 of the carrier amplifier 42 at this moment moves from a high level to a low level. However, since the amplifying element 52 is in the saturation range, the high-efficiency is achieved.

When the input level from the input terminal A21 is further increased, the amplifying element 55 of the peak amplifier 44 also starts to be saturated. However, since both the amplifying elements 52 and 55 are saturated, high-efficiency is also achieved.

FIG. 9 shows an example of theoretical collector efficiency or drain efficiency relating to the Doherty amplifier shown in FIG. 8. In a graph in FIG. 9, the lateral axis represents the back-off (dB) and the vertical axis represents the efficiency (%).

Assuming that the minimum input level to the input terminal A21 at which both the amplifying elements 52 and 55 are saturated, that is, a compression point, to be 0 dB, the back-off here is a numerical value showing an excess of the input level with respect to the compression point.

In this example, the term "collector efficiency" means a ratio of radio-frequency output power which can be gained from a collector with respect to a product of a voltage (direct current) applied to the collector from a power source and an electric current (direct current) supplied from the power source. The drain efficiency has also a similar signification.

The graph in FIG. 9 shows an example of efficiency of a general Class B amplifier (broken line), and an example of efficiency of a simple model of the Doherty amplifier (solid line). A section in which the back-off is 6 dB or higher is designated as Section A, a section in which the back-off is in a range from 0 dB to 6 dB is designated as Section B, and a section in which the back-off is lower than 0 dB is designated as Section C.

Basically, when the input level is in Section A, only the carrier amplifier 42 operates. The carrier amplifier 42 starts to be saturated in the area where the back-off reaches 6 dB, and the efficiency reaches a point near the maximum efficiency of the Class B amplifier. The output of the carrier amplifier 42 at this moment is about (P0/4), where the maximum output of the Doherty amplifier is P0.

In Section B in which the back-off is 6 dB or lower, the output of the carrier amplifier 42 increases from about (P0/4) to (P0/2) as the input level increases, and the output of the peak amplifier 44 increases from about 0 to (P0/2). The sum of the output power from the carrier amplifier 42 and the output power from the peak amplifier 44 here is proportional to the input power to the input terminal A21 at the same constant of proportionality as in Section A. When the peak amplifier 44 starts to operate, the efficiency is lowered once. However, the efficiency reaches the peak again at the compression point at which the peak amplifier 44 also starts to be saturated. The output from the carrier amplifier 42 and the output from the peak amplifier 44 are equal at the compression point.

In general, the CDMA signals and the multi-carrier signals have a high peak factor, that is, a ratio between peak power and average power is high. However, the general amplifiers employ an operating point which is lowered from the compression point correspondingly so as to be able to cope with a peak factor of 7 to 12 dB.

Referring now to FIG. 8, an example of impedances at the respective components will be described.

Since the value Z0, which is the output load 47, is specified to a constant value, this is employed as a starting point. An impedance Z7 of the node 58 with respect to the λ/4 transformer 46 is expressed as in a formula (1).

[Expression 1]

$$Z7 = (Z2)^2 / Z0 \qquad (1)$$

where Z2 is a characteristic impedance of the λ/4 transformer 46.

An impedance Z4 of the output matching circuit 53 of the carrier amplifier 42 with respect to the λ/4 transformer 57 is obtained in the same manner as shown above since an output impedance of the output matching circuit 56 of the peak amplifier 44 is substantially infinity in Section A. Since the load is equally divided in Section C, a load impedance of the amplifying circuit of the carrier amplifier 42 (an amount of contribution of the amplifying circuit at the node 58) and a load impedance of the output matching circuit 56 of the peak amplifier 44 are 2(Z7), respectively. Therefore, a formula (2) and a formula (3) are established.

A value Z5 here is the load impedance of the output matching circuit 56 of the peak amplifier 44 with respect to the peak amplifier 44 of the node 58, and Z1 is a characteristic impedance of the λ/4 transformer 57.

In Section B, the impedance Z4 and the impedance Z5 transfer between a value in Section A and a value in Section C.

In particular, changing of the load of the carrier amplifier 42 is referred to as a load modulation.

[Expression 2]

(Section A)

$$Z4 = \frac{(Z1)^2}{Z7} = \frac{(Z1)^2}{((Z2)^2/Z0)} = Z0\frac{(Z1)^2}{(Z2)^2}$$

(Section C)

$$Z4 = \frac{(Z1)^2}{2(Z7)} = (1/2)Z0\frac{(Z1)^2}{(Z2)^2} \quad (2)$$

[Expression 3]

(Section A)

$$Z5 = \infty$$

(Section C)

$$Z5 = 2(Z7) \quad (3)$$

A case in which the Doherty amplifier is applied to a high-frequency area will be described.

That is, when the input signal level is high (Section C), the impedance Z4 is half the impedance value demonstrated when the input signal level is low (Section A). In other words, the impedance Z4 changes double in load. For example, when Z7=25Ω (ohm) and Z1=50Ω, the value of Z4 varies in a range between 100 and 50Ω. Therefore, the load impedance of the amplifying element 52 of the carrier amplifier 42 also varies.

In addition to the Doherty amplifier as described above, a Doherty amplifier which compensates deterioration of the characteristic by controlling gate bias voltage according to drain current especially for the carrier amplifier is known (for example, see Patent Document 1).

Patent Document 1: JP-A-2004-260232

DISCLOSURE OF THE INVENTION

However, with the Doherty amplifier in the related art, when it is applied to the high-frequency range using the amplifying element of a semiconductor, it is difficult to match the impedance of the amplifying element to a Doherty theory, because a load line of the amplifying element 52 in the carrier amplifier 42 is changed by the output matching circuit 53, and a range of the load modulation is unique and has less flexibility.

FIG. 10 is a Smith Chart showing an example of variations in the load impedance of the amplifying element 52 of the carrier amplifier 42.

Reference signs ZA, ZB and ZC represent the load impedances of the amplifying element 52 of the carrier amplifier 42, which are normally values of several Ω to over ten Ω or smaller, are significantly smaller than the impedance Z4, and are not a forward resistance.

The Smith Chart in this example is normalized with a given resistance between ZA and Z4.

Three closed curves drawn around Za are, from the inside, isopower lines corresponding respectively to {9(Pm)/10}, (Pm/2) and (Pm/4) showing that the maximum output Pm of the carrier amplifier 42 is obtained at ZA, and the output obtained is reduced when matching is not achieved. Four lines (broken lines) drawn as they extend across the isopower lines are isoefficiency lines showing that the efficiency reduces in sequence from efficiency a, efficiency b, efficiency c to efficiency d.

The output matching circuit 53 of the carrier amplifier 42 converts the load impedance of the amplifying element 52 into the input impedance Z4 of the λ/4 transformer 57. When the output matching circuit 53 is composed, for example, of a lumped constant circuit, it converts the impedance along an isoresistance circle or an isoconductance circle on the Smith Chart. This method of conversion is arbitrary, and hence simplified lines (broken lines) are shown in FIG. 10.

Since the value of Z4 reduces from $\{Z0(Z1)^2/(Z2)^2\}$, that is, from Z4 (Section A) to $\{Z0(Z1)^2/2(Z2)^2\}$, that is, Z4 (Section C) in association with increase in input level, the value of Z4 (Section A) matches the value of, for example, ZB by matching Z4 (Section C) to ZA so as to obtain the maximum output in Section C. However, since an output of (Pm/4) is obtained in any impedance in the isopower line, it is more efficient to match ZA to the point ZC than to the point ZB. In other words, the amplifying element 52 operates at the highest efficiency when the load impedance of the amplifying element 52 of the carrier amplifier 42 is matched so as to transfer from ZC to ZA with the increase in input level.

In the description given above, only the output and the efficiency are considered. However, the output, the efficiency, gain and distortion are generally used as indexes which express the performance of the amplifier. In the case in which the matching which satisfies a given performance of the amplifying element from among those shown above is considered as well, there is a case in which the load impedance of the amplifying element 52 of the carrier amplifier 42 is better to be transferred from inside to outside in association with increase in the input level with respect to the center of the Smith Chart than from outside to inside as shown in FIG. 10. There is also a case in which it is better to be moved from a given point which has better performance to ZA.

In view of such circumstances in the related art, it is an object of the present invention to provide an amplifying system in which the performance is improved in comparison with, for example, the Doherty amplifier in the related art by achieving an adequate matching.

In order to achieve the above-described object, the present invention provides an amplifying system as shown below.

(1) An amplifying system for amplifying a signal including:

distributing means that distributes the signal;

a carrier amplifier that amplifies a distributed first signal in Class AB;

a peak amplifier that amplifies a distributed second signal in Class B or Class C;

a first transmission line having a given electric length, the first transmission line being connected to an output of the carrier amplifier;

a second transmission line having a given electric length, the second transmission line being connected to an output of the peak amplifier; and a combining end that combines an output of the first transmission line and an output of the second transmission line, (wherein the electric length of the first transmission line is set to achieve better efficiency of the carrier amplifier when an input level of the signal is lower than that obtained when the line length is $\lambda/4$), wherein an impedance at the combining end is set to be different from a parallel impedance of load impedances of the carrier amplifier and the peak amplifier converted respectively by the first transmission line and the second transmission line at the maximum power, (so that the performance of the amplifying system is improved).

(1-1) The amplifying system according to (1), (wherein the first transmission line has a characteristic impedance which is substantially the same as the load impedance of the carrier amplifier at the maximum power, the second transmission line has a characteristic impedance which is substantially the same as the load impedance of the peak amplifier at the maximum power), a first amplifying circuit includes a first preamplifier which operates in Class AB, and a second amplifying circuit includes a second preamplifier which operates at any one of Class A to Class C.

(2) An amplifying system for amplifying a signal including:

distributing means that distributes the signal, a carrier amplifier that amplifies a distributed first signal by the distributor in Class AB;

a peak amplifier that amplifies a distributed second signal in Class B or Class C;

a first transmission line having a given electric length, the first transmission line being connected to an output of the carrier amplifier;

a second transmission line having a given electric length, the second transmission line being connected to an output of the peak amplifier; and a combining end that combines an output of the first transmission line and an output of the second transmission line, wherein load impedances of the carrier amplifier and the peak amplifier at the maximum power are differentiated, the impedance of the combining end is equalized to a parallel impedance of the load impedances of the carrier amplifier and the peak amplifier at the maximum power, a range of load modulation can be set as desired with the maximum output of a first amplifying circuit unchanged, so that optimal matching is achieved in at least one of efficiency, distortion and gain (may be all).

(2-1) The first amplifying system according to (2), (wherein the first transmission line includes a characteristic impedance which is substantially the same as the load impedance of the carrier amplifier at the maximum power, the second transmission line has a characteristic impedance which is substantially the same as the load impedance of the peak amplifier at the maximum power), a first amplifying circuit includes a first preamplifier which operates in Class AB, and a second amplifying circuit includes a second preamplifier which operates at any one of Class A to Class C.

(3) An amplifying system for amplifying a signal including:

distributing means that distributes the signal, a carrier amplifier that amplifies a distributed first signal by the distributor in Class AB;

a peak amplifier that amplifies a distributed second signal in Class B or Class C;

a first transmission line having a given electric length, the first transmission line being connected to an output of the carrier amplifier;

a second transmission line having a given electric length, the second transmission line being connected to an output of the peak amplifier; and a combining end that combines an output of the first transmission line and an output of the second transmission line, wherein load impedances of the carrier amplifier and the peak amplifier at the maximum power are the same, wherein an impedance converter that converts the load impedance of the peak amplifier at the maximum power into a value different from the load impedance of the carrier amplifier at the maximum power is provided between the peak amplifier and the second transmission line, and the impedance of a combining point is a parallel impedance of the maximum load impedance of the carrier amplifier and the impedance converted by the impedance converter.

(3-1) The amplifying system according to (3), (wherein the first transmission line has the same characteristic impedance as the load impedance of the carrier amplifier at the maximum power, wherein the second transmission line has the same characteristic impedance as the load impedance of the peak amplifier at the maximum power), a first amplifying circuit includes a first preamplifier which operates in Class AB, and a second amplifying circuit includes a second preamplifier which operates in any one of Class A to Class C.

According to the amplifying system in the present invention, the signal is amplified through a configuration as shown below.

That is, the distributing means distributes the signal. The carrier amplifier amplifies the distributed first signal in Class AB. The peak amplifier amplifies the distributed second signal in Class B or Class C. The first transmission line connected to the output of the carrier amplifier has a given electric length. The second transmission line connected to the output of the peak amplifier has a given electric length. The combining end combines the output of the first transmission line and the output of the second transmission line. (The electric length of the first transmission line is set to a value at which the efficiency of the carrier amplifier when the input level of the signal is low is better than that when the line length is $\lambda/4$). The impedance of the combining end is set to be different from the parallel impedance of the load impedances of the carrier amplifier and the peak amplifier at the maximum power which are converted respectively by the first transmission line and the second transmission line (in order to improve the performance of the amplifier).

In this case, although there is slight lowering of power, the impedance is set to a value at which the performance of the amplifying system is improved by changing the length of the transmission line which constitutes an impedance converting means and the impedance at a connecting point by the impedance converter which continues further conversion into a specific output load.

Therefore, for example, the performance is improved in comparison with, for example, the Doherty amplifier in the related art by achieving adequate matching.

For example, the load impedances of the carrier amplifier and the peak amplifier at the maximum power are set to the same value.

For example, the distributing means here may be composed of a distributor, first amplifying means is composed of the carrier amplifier, and second amplifying means is composed of the peak amplifier.

The length of the transmission line which constitutes the impedance converting means may be various values in the range from 0 to λ/2, or may be various values in the range longer than λ/2. When a length of 0 is employed for the transmission line, it means that the transmission line does not exist.

As a mode to set the values at which the performance of the amplifier is improved, for example, a mode in which adequate matching is achieved in at least one of efficiency, distortion and gain.

For example, a configuration in which means for converting the impedance is provided between a point for combining the output from the first amplifying means and the output from the second amplifying means and the second amplifying means is also applicable.

For example, one or both of the first amplifying means and the second amplifying means may be composed of a plurality of amplifiers arranged in parallel. In this case, for example, the distributing means distributes an input signal into the same number of signals as the total number of amplifiers.

For example, a configuration in which the amplifying means (preamplifier means) is provided between the distributing means and the first amplifying means or between the distributing means and the second amplifying means for achieving amplification upstream is also applicable.

The amplifying system in the present invention is configured as shown below as an example.

That is, the first amplifying circuit on the carrier amplifier side includes the first preamplifier which operates in Class AB, and the second amplifying circuit on the peak amplifier side includes the second preamplifier which operates in any one of Class A to Class C. (The first transmission line includes substantially the same characteristic impedance as the load impedance of the carrier amplifier at the maximum power, and the second transmission line includes substantially the same characteristic impedance as the load impedance of the peak amplifier at the maximum power.)

Therefore, source efficiency in the amplifying system is improved.

According to the amplifying system in the present invention, the signal is amplified through the configuration as shown below.

That is, the distributing means distributes the signal. The carrier amplifier amplifies the distributed first signal in Class AB. The peak amplifier amplifies the distributed second signal in Class B or Class C. The first transmission line connected to the output of the carrier amplifier has a given electric length. The second transmission line connected to the output of the peak amplifier has a given electric length. The combining end combines the output of the first transmission line and the output of the second transmission line.

The load impedances of the peak amplifier and the carrier amplifier at the maximum power are different from each other. Furthermore, the first transmission line impedance is matched to the load impedance of the carrier amplifier at the maximum power and the second transmission line impedance is matched to the load impedance of the peak amplifier at the maximum power.

(The electric length of the first transmission line is set to a value at which the efficiency of the carrier amplifier when the input level of the signal is low is improved, and a load impedance ratio of the carrier amplifier and the peak amplifier at the maximum power is also set to a value at which the performance of the amplifiers is improved as a whole).

In this case, the length of the transmission line which constitutes the impedance converting means and the load impedance ratio are set to a value at which the performance of the amplifying system is improved.

Therefore, for example, the load modulation is achieved as desired, so that the performance of the amplifying element is sufficiently demonstrated.

For example, the impedance of the combining end is set as the parallel impedance of the load impedances of the carrier amplifier and the peak amplifier at the maximum power differentiated from each other.

For example, the distributing means here may be composed of the distributor, the first amplifying means may be composed of the carrier amplifier, and the second amplifying means may be composed of the peak amplifier.

The length of the transmission line which constitutes the impedance converting means may be various values in the range from 0 to λ/2, or may be various values in the range longer than λ/2. When a length of 0 is employed for the transmission line, it means that the transmission line does not exist.

As a mode to set the values at which the performance of the amplifier is improved, for example, a mode in which adequate matching is achieved in at least one of efficiency, distortion and gain.

For example, a configuration in which means for converting the impedance is provided between a point for combining the output from the first amplifying means and the output from the second amplifying means and the second amplifying means is also applicable.

For example, one or both of the first amplifying means and the second amplifying means may be composed of a plurality of amplifiers arranged in parallel. In this case, for example, the distributing means distributes an input signal into the same number of signals as the total number of amplifiers.

For example, a configuration in which the amplifying means (preamplifier means) is provided between the distributing means and the first amplifying means or between the distributing means and the second amplifying means for achieving amplification upstream is also applicable.

The amplifying system in the present invention is configured as shown below as an example.

That is, the first amplifying circuit on the carrier amplifier side includes the first preamplifier which operates in Class AB, and the second amplifying circuit on the peak amplifier side includes the second preamplifier which operates in any one of Class A to Class C. (The first transmission line includes the same characteristic impedance as the load impedance of the carrier amplifier at the maximum power, and the second transmission line includes the same characteristic impedance as the load impedance of the peak amplifier at the maximum power.

Therefore, source efficiency in the amplifying system is improved.

According to the amplifying system in the present invention, the signal is amplified through the configuration as shown below.

That is, the distributing means distributes the signal. The carrier amplifier amplifies the distributed first signal in Class AB. The peak amplifier amplifies the distributed second signal in Class B or Class C. The first transmission line connected to the output of the carrier amplifier has a given electric length. The second transmission line connected to the output of the peak amplifier has a given electric length. The combining end combines the output of the first transmission line and the output of the second transmission line.

The load impedances of the carrier amplifier and the peak amplifier at the maximum power are the same. Then, the impedance converter provided between the peak amplifier and the second transmission line converts the load impedance of the peak amplifier at the maximum power into a value different from the load impedance of the carrier amplifier at the maximum power.

Therefore, the load impedances of the carrier amplifier and the peak amplifier at the maximum power may be equalized, and hence working property at the time of development and adjustment is improved, so that productivity is improved.

BEST MODE FOR CARRYING OUT THE PRESENT INVENTION

Figure 1:
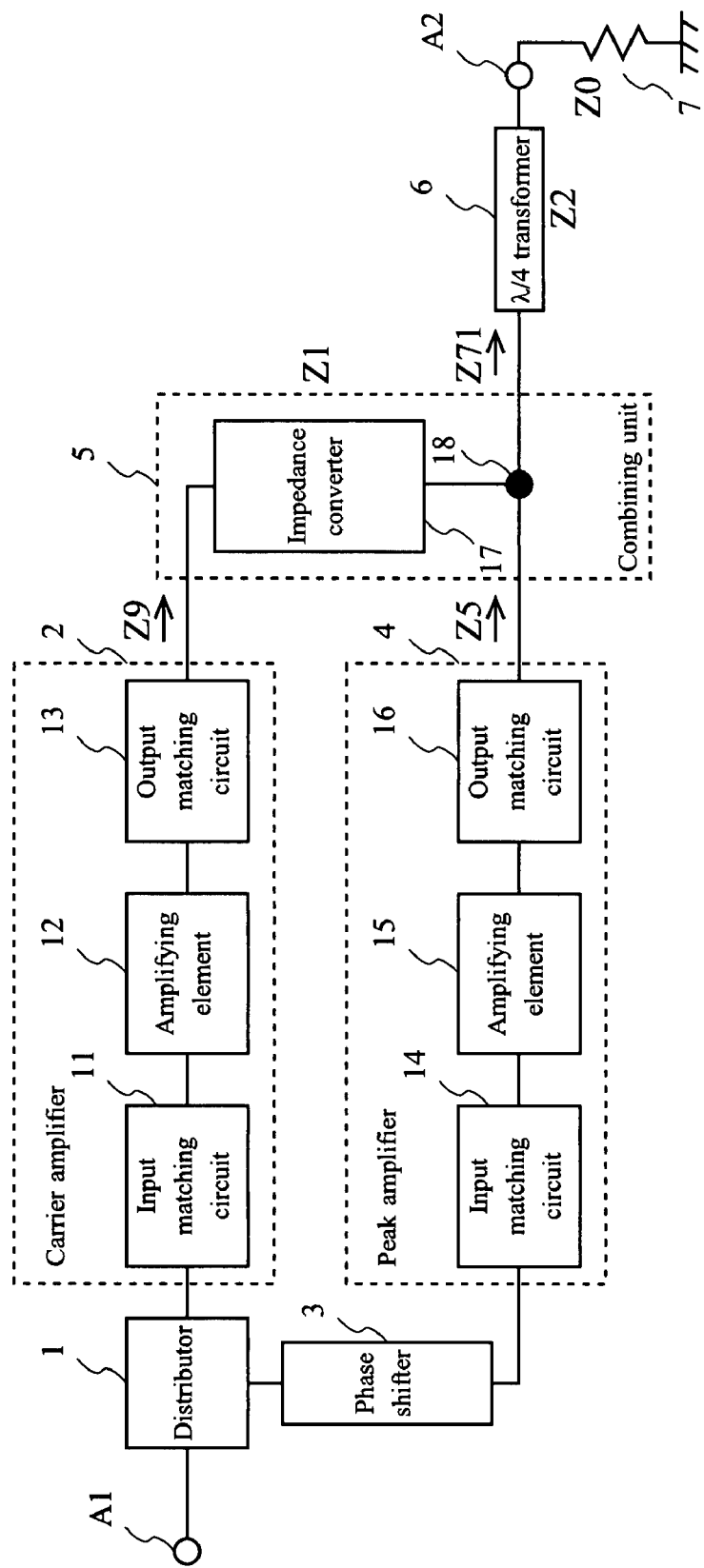
FIG. 1 illustrates an example of configuration of an amplifying system according to a first embodiment of the present invention.

Referring now to the drawings, embodiments of the present invention will be described.

First Embodiment

A first embodiment of the present invention will be described.

FIG. 1 shows an example of configuration of an amplifying system according to this embodiment.

The amplifying system according to this embodiment includes an input terminal A1, a distributor 1, a carrier amplifier 2, a phase shifter 3, a peak amplifier 4, a combining unit 5, a λ/4 transformer 6, an output terminal A2, and an output load 7.

The carrier amplifier 2 includes an input matching circuit 11, an amplifying element 12, and an output matching circuit 13.

The peak amplifier 4 includes an input matching circuit 14, an amplifying element 15, and an output matching circuit 16.

The combining unit 5 includes an impedance converter 17 and a node 18.

Normally, semi-conductor devices such as LD-MOS (Lateral Double-diffused MOS) or GaAs-FET, a HEMT and HBT are used as the amplifying elements 12 and 15.

For example, the input matching circuits 11 and 14 and the output matching circuits 13 and 16 may be composed of any one of a lumped constant circuit, a distributed constant circuit, or a combination thereof, and may include a stray capacitance or inductance, which cannot be avoided in practice.

The λ/4 transformer 6 may be formed on a wiring board as a conductive pattern having a line width corresponding to a characteristic impedance Z2 and a length corresponding to λ/4. Although matching is achieved in a relatively wide frequency range by using the λ/4 transformer as in this embodiment, other matching methods other than the λ/4 transformer may be employed as long as matching is achieved. A sign λ designates a wavelength of a signal.

Figure 8:
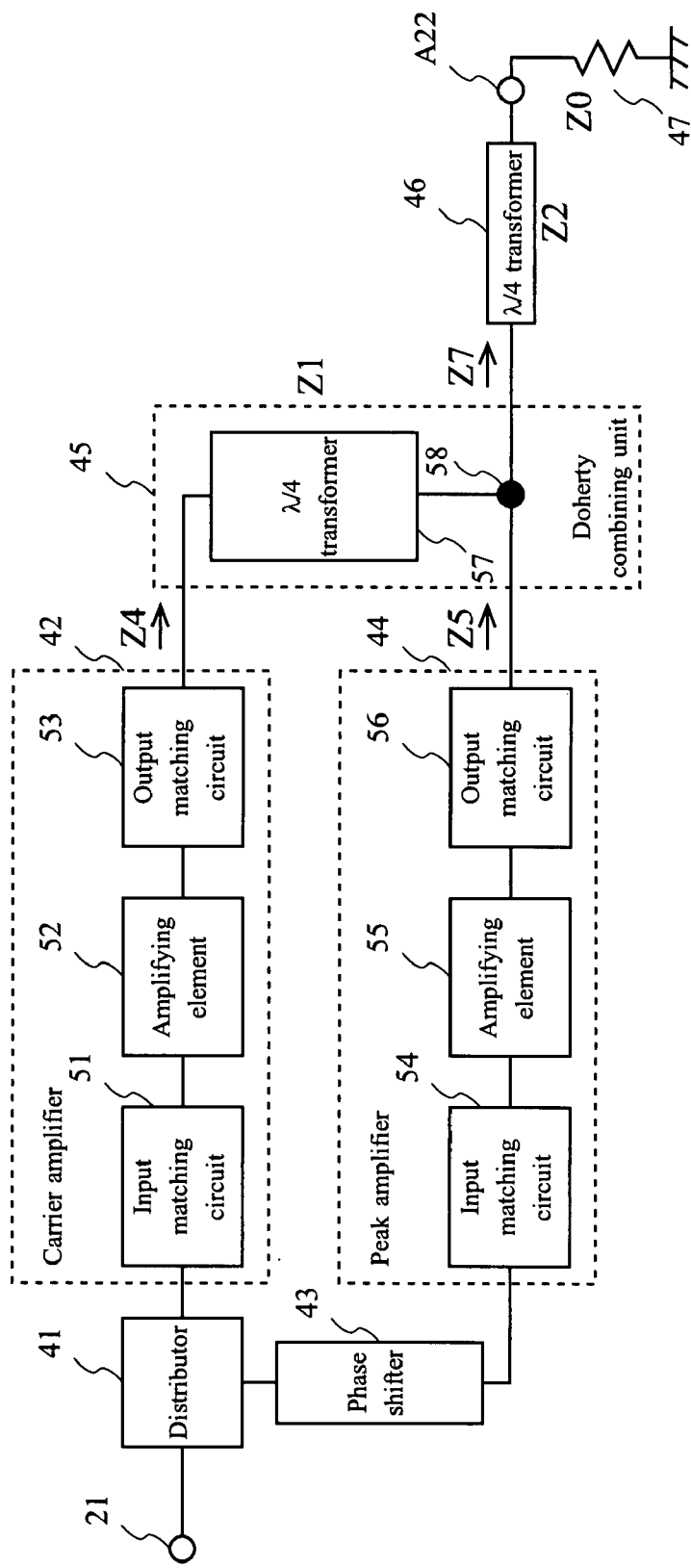
FIG. 8 illustrates an example of configuration of a Doherty amplifier.

The configuration of the amplifying system in this embodiment is different from the configuration of the amplifying system shown in FIG. 8 in that the impedance converter 17 having a given electric length is provided, in that the phase shifter 3 that generates a phase corresponding to the impedance converter 17, and in that the impedance relating to a combining point (node 18) is different, and other configurations are basically the same although the constant is different.

An example of operation done by the amplifying system in this embodiment will be shown.

The input terminal A1 receives supply of an input signal to the amplifying system in this embodiment.

The distributor 1 includes, for example, a T-junction line or a coupler formed on a wiring board, and distributes signals supplied from the input terminal A1.

The input matching circuit 11 of the carrier amplifier 2 converts an impedance of a part of the signal distributed by the distributor 1 to an input impedance of the amplifying element 12 provided downstream thereof.

The amplifying element 12 of the carrier amplifier 2 is biased to Class AB, and amplifies the signal applied with the impedance conversion by the input matching circuit 11.

Figure 9:
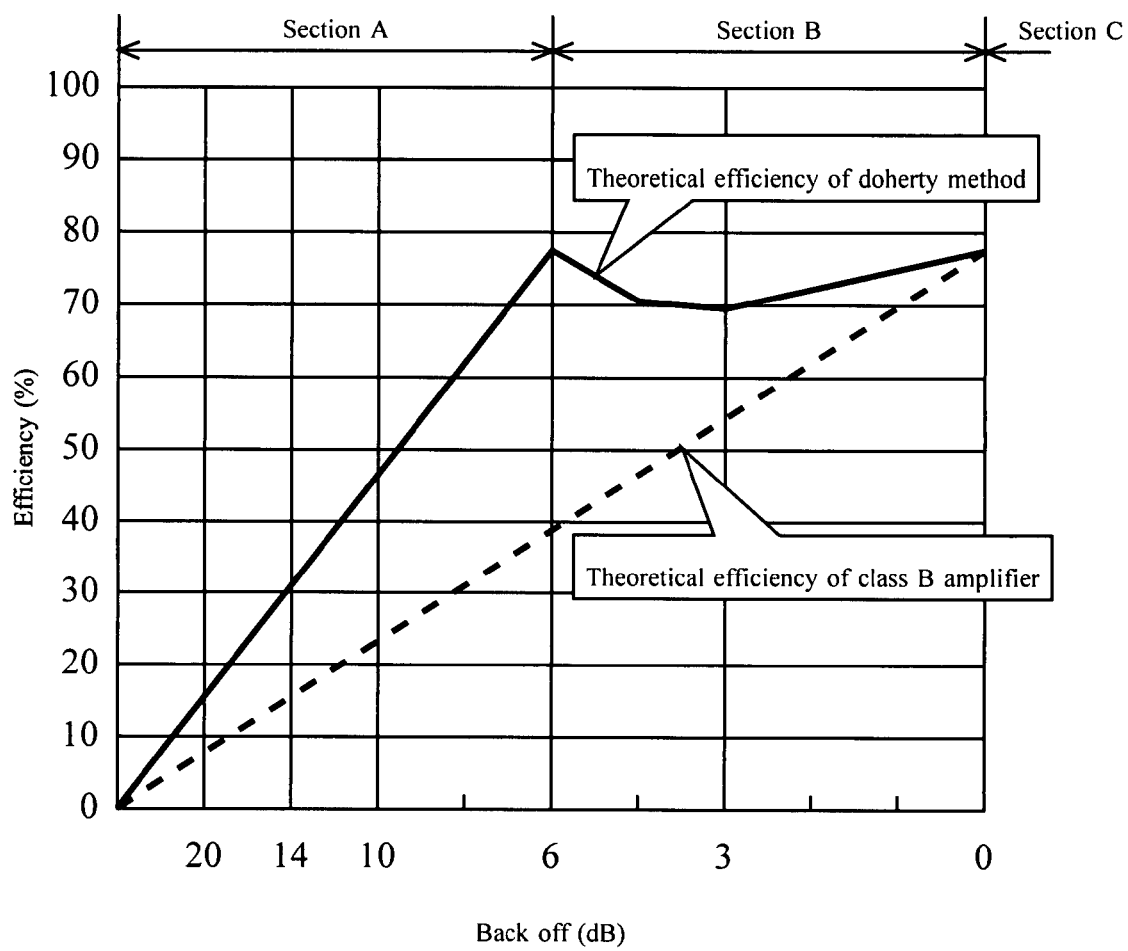
FIG. 9 illustrates an example of theoretical collector efficiency or drain efficiency according to the Doherty amplifier.
Figure 10:
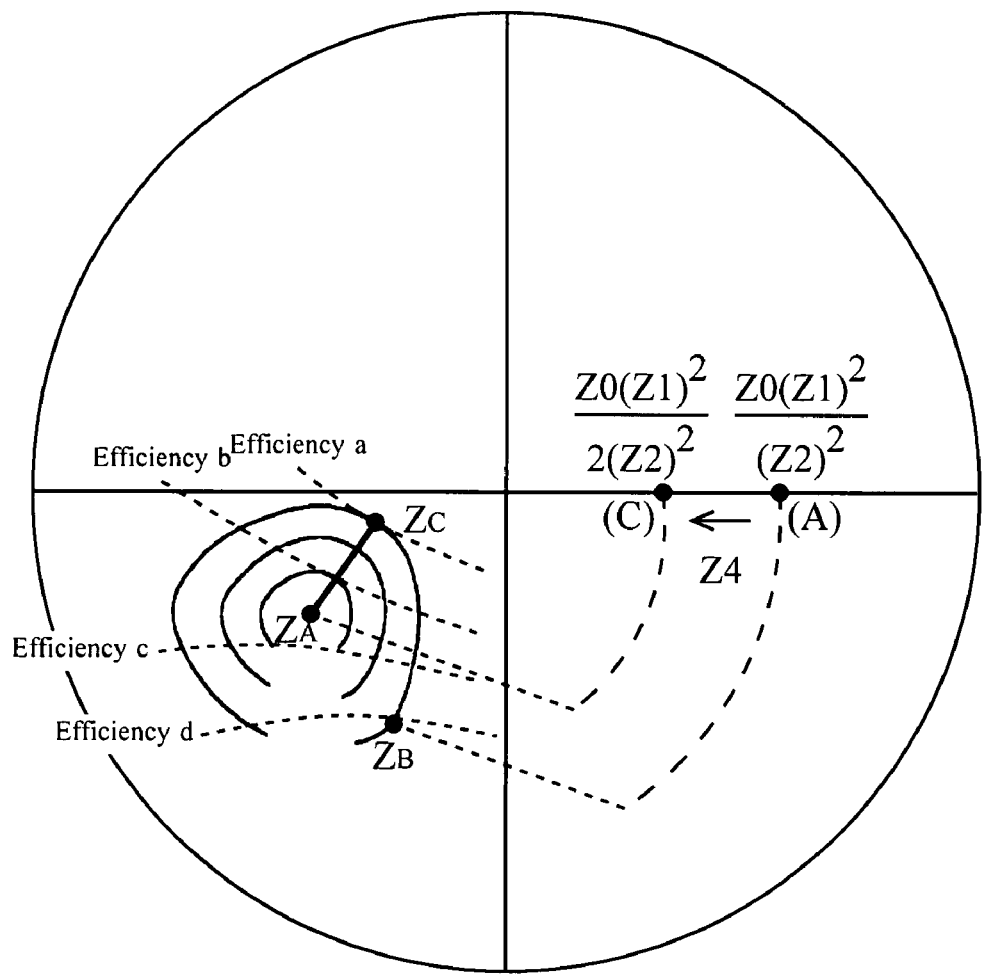
FIG. 10 is a Smith Chart showing an example of variations in load impedance of an amplifying element of the carrier amplifier.

The output matching circuit 13 of the carrier amplifier 2 converts a load impedance of the amplifying element 12 into a substantially circular impedance with the center at ZA in Section A, and to ZA in Section C for the signal amplified by the amplifying element 12. The respective sections (Section A, Section B and Section C) and ZA represent the similar ones to, for example, those shown in FIG. 9 and FIG. 10. A value Z9 represents an impedance of the impedance converter 17 with respect to the output matching circuit 13 of the carrier amplifier 2.

The phase shifter 3 changes the phase of the other part of the signal distributed by the distributor 1. The phase shifter 3 is a transmission line which causes the same delay, for example, as the impedance converter 17, and serves to match the combination. Therefore, the characteristics of the phase shifter 3 vary with the state of the phases of the carrier amplifier 2 and the peak amplifier 4. The phase shifter 3 may be provided on the input side of the carrier amplifier 2.

The input matching circuit 14 of the peak amplifier 4 converts the impedance of the other part of the distributed signal passed through the phase shifter 3 after having distributed by the distributor 1 into an input impedance of the amplifying element 15 located downstream thereof.

The amplifying element 15 of the peak amplifier 4 is biased into Class B or Class C, and amplifies the signal applied with the impedance conversion by the input matching circuit 14.

The output matching circuit 16 of the peak amplifier 4 matches a load impedance of the amplifying element 15 to Z5 for the signal amplified by the amplifying element 15.

The impedance converter 17 applies the impedance conversion to an output signal from the output matching circuit 13 of the carrier amplifier 2. The impedance converter 17 in this embodiment is composed of a transmission line having an electric length of L=0 to $\lambda/2$ or longer, and a characteristic impedance Z1 is equal to $2(Z7)=2(Z2)^2/Z0$. Here, Z0 represents the magnitude of the output load 7, and Z7 represents an impedance which is similar to, for example, those shown in FIG. 8.

The node 18 is a combining point for combining a signal outputted from the output matching circuit 13 of the carrier amplifier 2 and supplied via the impedance converter 17 and a signal outputted from the output matching circuit 16 of the peak amplifier 4. In this example, the carrier amplifier 2 and the peak amplifier 4 are combined by the transmission line (impedance converter 17).

Figure 2:
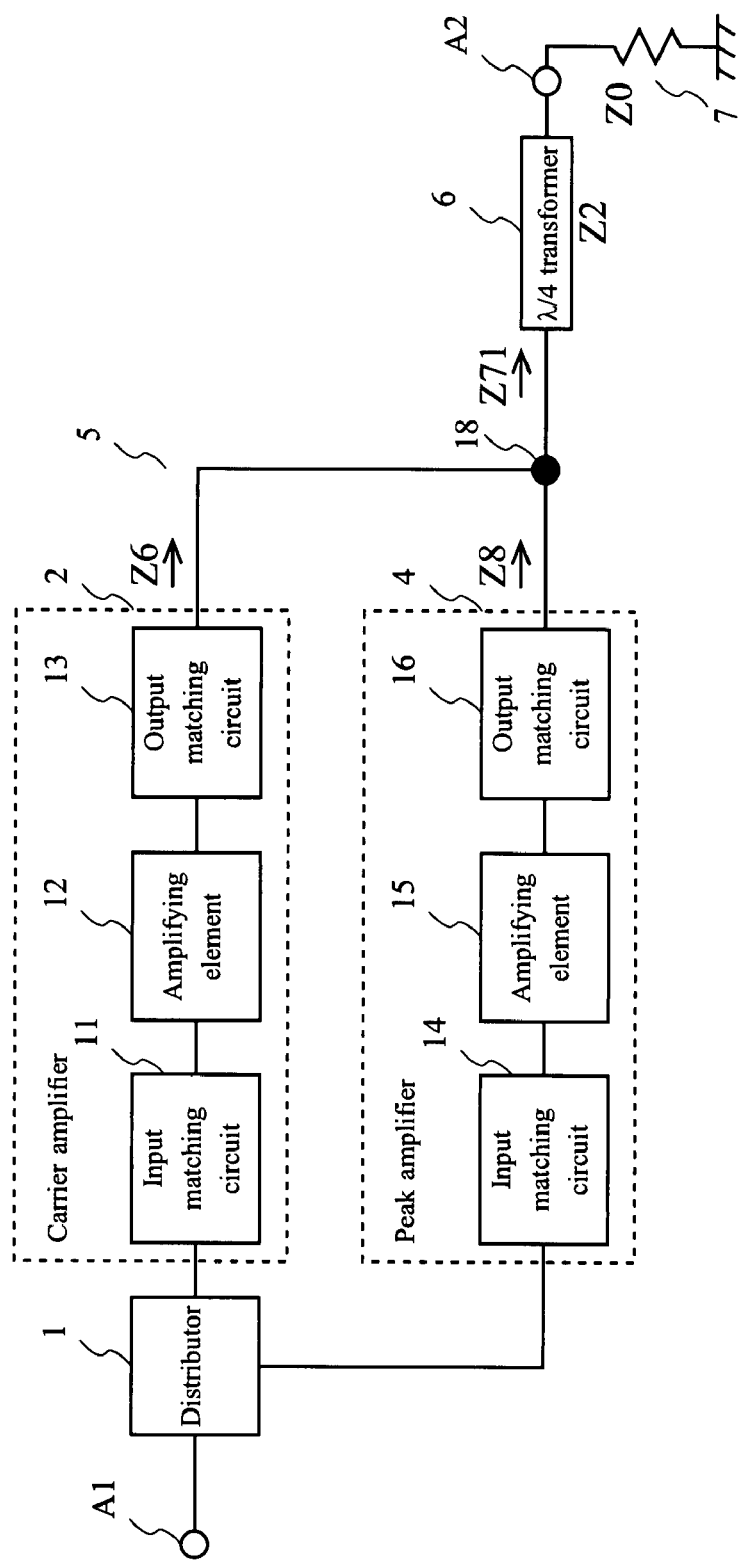
FIG. 2 illustrates an example of configuration of the amplifying system in a case in which an impedance converter is not provided.

When the length of this transmission line (impedance converter 17) is $0\lambda$, that is, the length is 0, the amplifying system of this embodiment has a structure in which the carrier amplifier 2 and the peak amplifier 4 are simply connected on the wiring board. FIG. 2 illustrates an example of configuration of the amplifying system in such a case. In FIG. 2, Z6 and Z8 represent impedances.

The $\lambda/4$ transformer 6 converts the (load) impedance of the node 18, $Z71=2(Z7)\cdot\alpha/(1+\alpha)$ to Z0, which is the output load 7, where $\alpha$ is a coefficient for assuming a case in which a load impedance Z4 of the carrier amplifier which is matched to 2(Z7) in the related art is matched to $2\alpha(Z7)$.

The output signal from the node 18 is outputted from the output terminal A2 via the $\lambda/4$ transformer 6.

Here, an impedance Z71 of the node 18 is determined by factorizing into loads on the carrier amplifier 2 side and the peak amplifier 4 side.

[Expression 4]

The load on the carrier amplifier side (4)
(Section A)

$$\text{parallel with 2 } (Z7) \text{ and 2 } (Z7)\cdot\alpha = \cfrac{1}{\cfrac{1}{2(Z7)} + \cfrac{1}{2(Z7)\alpha}}$$

$$= \cfrac{2(Z7)\alpha}{(1+\alpha)}$$

(Section C)
$2(Z7)\cdot\alpha$

The load Z5 on the peak amplifier side
(Section A)
$\infty$
(Section C)
$2(Z7)$

Figure 3:
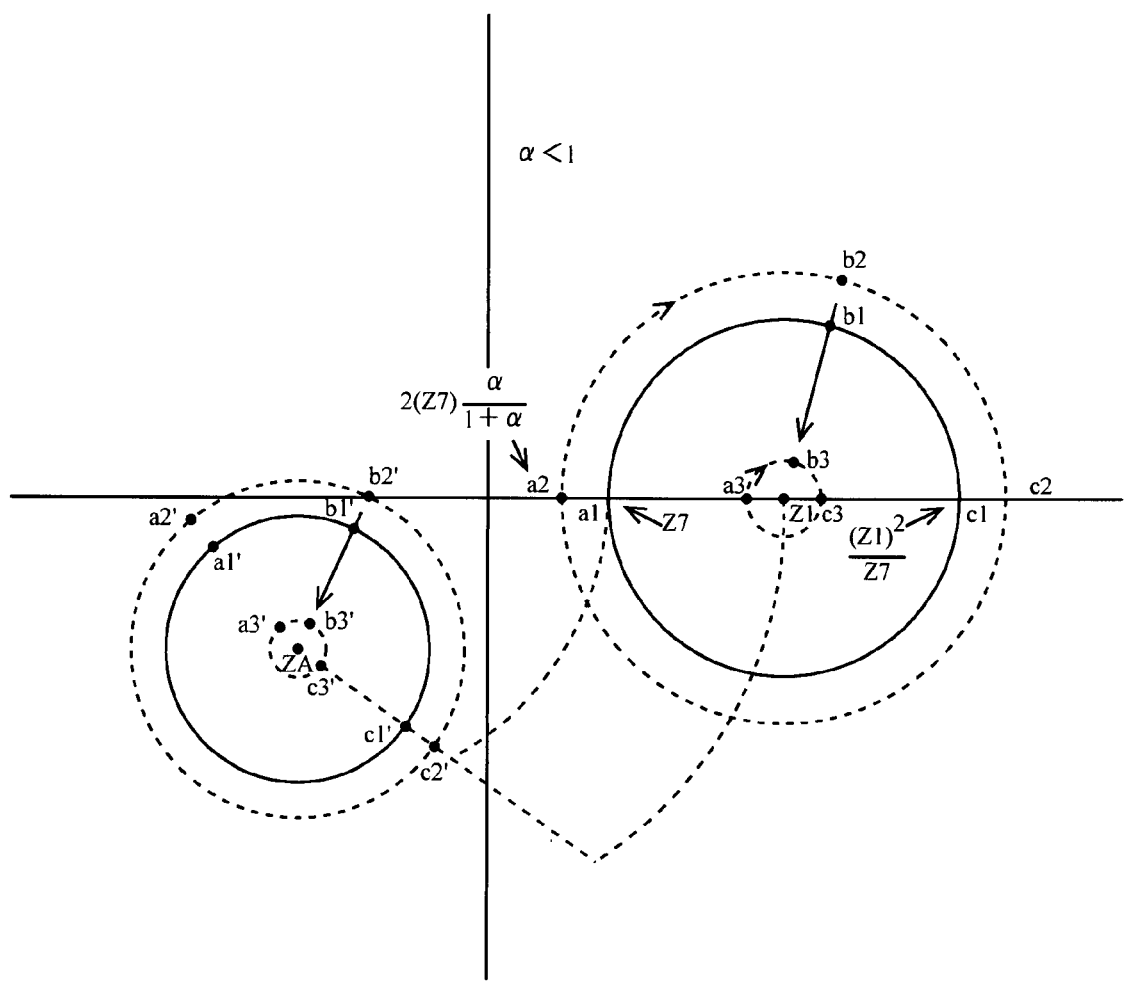
FIG. 3 is a Smith Chart showing an example of matching in a carrier amplifier with an output matching circuit and the impedance converter in a case in which α is smaller than 1.

FIG. 3 is a Smith Chart showing an example of matching by the output matching circuit 13 of the carrier amplifier 2 and the impedance converter 17.

A case of $\alpha=1$ will be described now.

In Section C, the impedance Z71 of the node 18 is Z7, and the output matching circuit 13 of the carrier amplifier 2 is configured so as to be capable of outputting Pm (so as to achieve the maximum output independently as the carrier amplifier 2) when the load Z9 of the output matching circuit 13 is Z1. In other words, the load impedance of the amplifying element 12 is matched to ZA by the output matching circuit 13, and in this case, the impedance converter 17 serves simply as the transmission line.

In section A, the output impedance of the output matching circuit 16 of the peak amplifier 4 is infinity, and hence Z9 becomes Z7 when the length L=0 or $\lambda/2$ represented by a point a1, and becomes $(Z1)^2/(Z7)$ when the length L=$\lambda/4$ represented by a point c1. When the length L of the transmission line (impedance converter 17) is changed in the range from 0 to $\lambda/2$, Z9 changes clockwise on a circle with the center at Z1.

The impedance on the circle with the center at Z1 is mapped on substantially a circle with the center at ZA by the output matching circuit 13 of the carrier amplifier 2. The point a1, a point b1 and the point c1 correspond to a point a1', a point b1' and a point c1', and it shows that the impedance is changed from the point a1', the point b1' and the point c1' when a length L is changed. Therefore, the length L may be set so that the point b1' demonstrates the most superior performance. In other words, the optimal positions different depending on the amplifying elements may be obtained by changing the length L irrespective of the position thereof on the circumference of the circle with the center at ZA.

However, when there is no matched point along the points a1'-b1'-c1'-a1', the matching point is obtained by changing the impedance of the combining point.

A case of $\alpha<1$ will now be described.

The fact that Pm is outputted when the load Z9 of the output matching circuit 13 is Z1 (the maximum output is achieved independently as the carrier amplifier 2) is the same.

A trajectory obtained in the case of $\alpha<1$ is shown by broken lines in FIG. 3.

Z9 in Section A is $\{2(Z7)\cdot\alpha/(1+\alpha)\}$, which is smaller than Z7 when the length indicated by a point a2 is L=0 or $\lambda/2$, and is $[(Z1)^2/\{2(Z7)\cdot\alpha/(1+\alpha)\}]$ when the length indicated by a point c2 is L=$\lambda/4$. When the length L of the transmission line (impedance converter 17) is changed to a range from 0 to λ/2, Z9 changes clockwise on a circle larger than the circle in the case of α=1 with the center at Z1 (that is, on the larger circle).

The impedance on the circle with the center at Z1 is mapped on substantially a circle with the center at ZA by the output matching circuit 13 of the carrier amplifier 2. The point a2, a point b2 and the point c2 correspond to a point a2', a point b2' and a point c2', and it shows that the impedance is changed from the point a2', the point b2' and the point c2' when the length L is changed. Therefore, when the point b2' demonstrates the most superior performance, the length L at that time may be employed.

Since the load impedance is 2(Z7)·α, the impedance Z9 of the output matching circuit 13 of the carrier amplifier 2 in Section C is {2(Z7)·α}, which is, for example, smaller than 2(Z7), when L=0 or λ/2 at a point a3, and is $[(Z1)^2/\{2(Z7) \cdot \alpha\}]$ when L=λ/4 indicated by a point c3. When the length L of the transmission line (impedance converter 17) is changed in the range from 0 to λ/2, Z9 changes clockwise on a small circle with the center at Z1.

The impedance on the circle with the center at Z1 is mapped on substantially a circle with the center at ZA by the output matching circuit 13 of the carrier amplifier 2. The point a3, a point b3 and the point c3 correspond to a point a3', a point b3' and a point c3', and it shows that the impedance is changed from the point a3', the point b3' and the point c3' when the length L is changed. Therefore, although it is different from ZA which demonstrates the best performance, it is a small circle, and hence there is only a small difference.

When the input level is increased and hence is moved from Section A to Section C, the load impedance of the amplifying element 12 of the carrier amplifier 2 is moved from b2' to b3'.

When there is no preferable matching point on the points a1'-b1'-c2'-a1' or on the points a2'-b2'-c2'-a2', the length of the broken line in FIG. 3 may be increased or decreased by changing the value α to change the impedance at the combining point, so that the optimal point is obtained.

A case of α>1 will now be described.

The fact that Pm is outputted when the load Z9 of the output matching circuit 13 is Z1 (the maximum output is achieved independently as the carrier amplifier 2) is the same.

Figure 4:
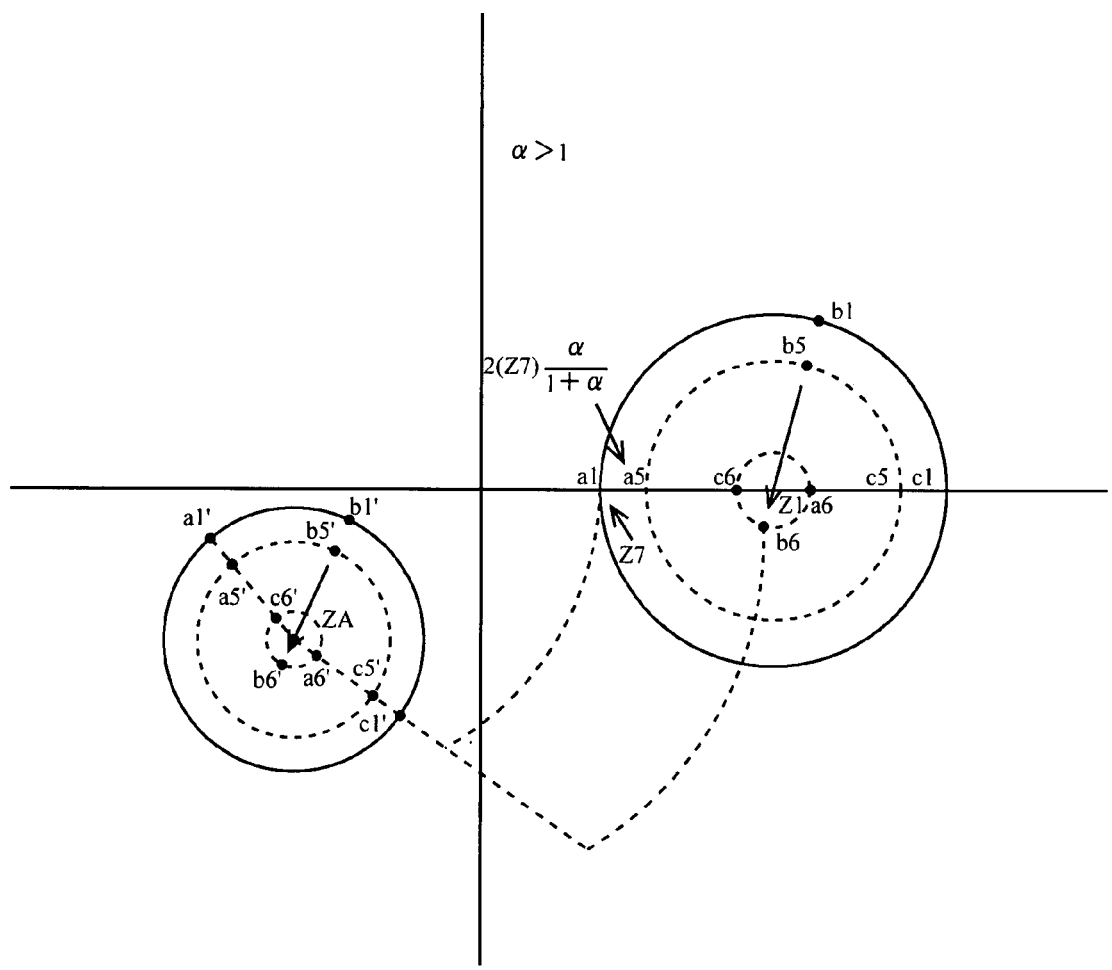
FIG. 4 is a Smith Chart showing an example of matching in the carrier amplifier with the output matching circuit and the impedance converter in a case in which α is larger than 1.

FIG. 4 is a Smith Chart showing an example of matching by the output matching circuit 13 of the carrier amplifier 2 and the impedance converter 17.

A trajectory obtained in the case of α>1 is shown by broken lines in FIG. 4.

Z9 in Section A is {2(Z7)·α/(1+α)}, which is larger than Z7 when the length indicated by a point a5 is L=0 or λ/2, and is $[(Z1)^2/\{2(Z7) \cdot \alpha/(1+\alpha)\}]$ when the length indicated by the point c5 is L=λ/4. When the length L of the transmission line (impedance converter 17) is changed to a range from 0 to λ/2, Z9 changes clockwise on a circle smaller than the circle in the case of α=1 with the center at Z1 (that is, on the smaller circle).

The impedance on the circle with the center at Z1 is mapped on substantially a circle with the center at ZA by the output matching circuit 13 of the carrier amplifier 2. The point a5, a point b5 and the point c5 correspond to a point a5', a point b5' and a point c5', and it shows that the impedance is changed from the point a5', the point b5' and the point c5' when the length L is changed. Therefore, when the point b5' demonstrates the most superior performance, the length L at that time may be employed.

The impedance Z9 of the output matching circuit 13 of the carrier amplifier 2 in Section C is {2(Z7)·α}, which is larger than, for example, 2 (Z7), when L=0 or λ/2 indicated by a point c6 since the load impedance is {2(Z7)·α}, and is [(Z1)$^2$/{2(Z7)·α}] when L=λ/4 indicated by a point c6. When the length L of the transmission line (impedance converter 17) is changed in the range from 0 to λ/2, Z9 changes clockwise on a small circle with the center at Z1.

The impedance on the circle with the center at Z1 is mapped on substantially a circle with the center at ZA by the output matching circuit 13 of the carrier amplifier 2. The point a6, a point b6 and the point c6 correspond to a point a6', a point b6' and a point c6', and it shows that the impedance is changed from the point a6', the point b6' and the point c6' when the length L is changed. Therefore, although it is different from ZA which demonstrates the best performance, it is a small circle, and hence there is only a small difference.

When the input level is increased and hence is moved from Section A to Section C, the load impedance of the amplifying element 12 of the carrier amplifier 2 is moved from b5' to b6'.

In other words, the optimal point is obtained by changing α to change the diameter of the broken line.

The configuration of the amplifying system shown in FIG. 2 is such that the length L of the transmission line (impedance converter 17) is set to 0, which means that there is no transmission line, and hence it may be better since there is less loss. It is to be selected according to the condition of the element.

The length L of the transmission line (impedance converter 17) is set to the range from 0 to λ/2 in the description give above. However, it may be longer since there is a case in which the distance between the output matching circuits 13 and 16 cannot be reduced to a distance shorter than λ/2 because, for example, the amplifying elements 12 and 15 are large in practice.

In the configuration of the amplifying system in this embodiment in which the outputs from the plurality of amplifying circuits are combined and outputted as described above, the plurality of amplifying circuits include a first amplifying circuit which operates the amplifying element 12 in Class AB (the carrier amplifier 2 in this embodiment) and a second amplifying circuit which operates the amplifying element 15 in Class B or Class C (the peak amplifier 4 in this embodiment), the output from the first amplifying circuit is combined with the output from the second amplifying circuit in the transmission line (impedance converter 17) having a given electricity length, and the impedance of the combining point is changed to reduce to a level smaller than the maximum output of the first amplifying circuit, so that optimal matching is achieved in at least one of efficiency, distortion and gain (may be all).

As a matter of course, since the load of the output terminal A2 is Z0, the impedance of Z2 is changed to achieve matching to a parallel impedance of 2(Z7) and 2(Z7)·α.

The amplifying system according to this embodiment is configured in such a manner that, for example, the load impedance of the second amplifying circuit is the same as a transmission impedance of the transmission line (impedance converter 17) having a given electric length to achieve a performance to obtain the maximum output, and a ratio of conversion is changed by the λ/4 transformer 6 which converts into the load impedance of the amplifying system.

The amplifying system according to this embodiment is configured in such a manner that the maximum output matching impedance of the first amplifying circuit is equal to the transmission impedance of the transmission line (impedance converter 17) having a given electric length.

Since the amplifying system according to this embodiment is not fixated on, for example, the λ/4 transformer, which is the characteristic of the Doherty amplifier in the related art, so that the output matching circuit 13 of the first amplifying circuit is matched to an impedance which is superior in combining performance.

In this manner, with the amplifying system according to this embodiment, a performance which is superior to the Doherty amplifier in the related art is realized by achieving adequate matching and, for example, the performance in the case in which the amplifying element which is hard to be matched with the Doherty amplifier in the related art is improved.

Second Embodiment

A second embodiment of the present invention will be described.

Figure 5:
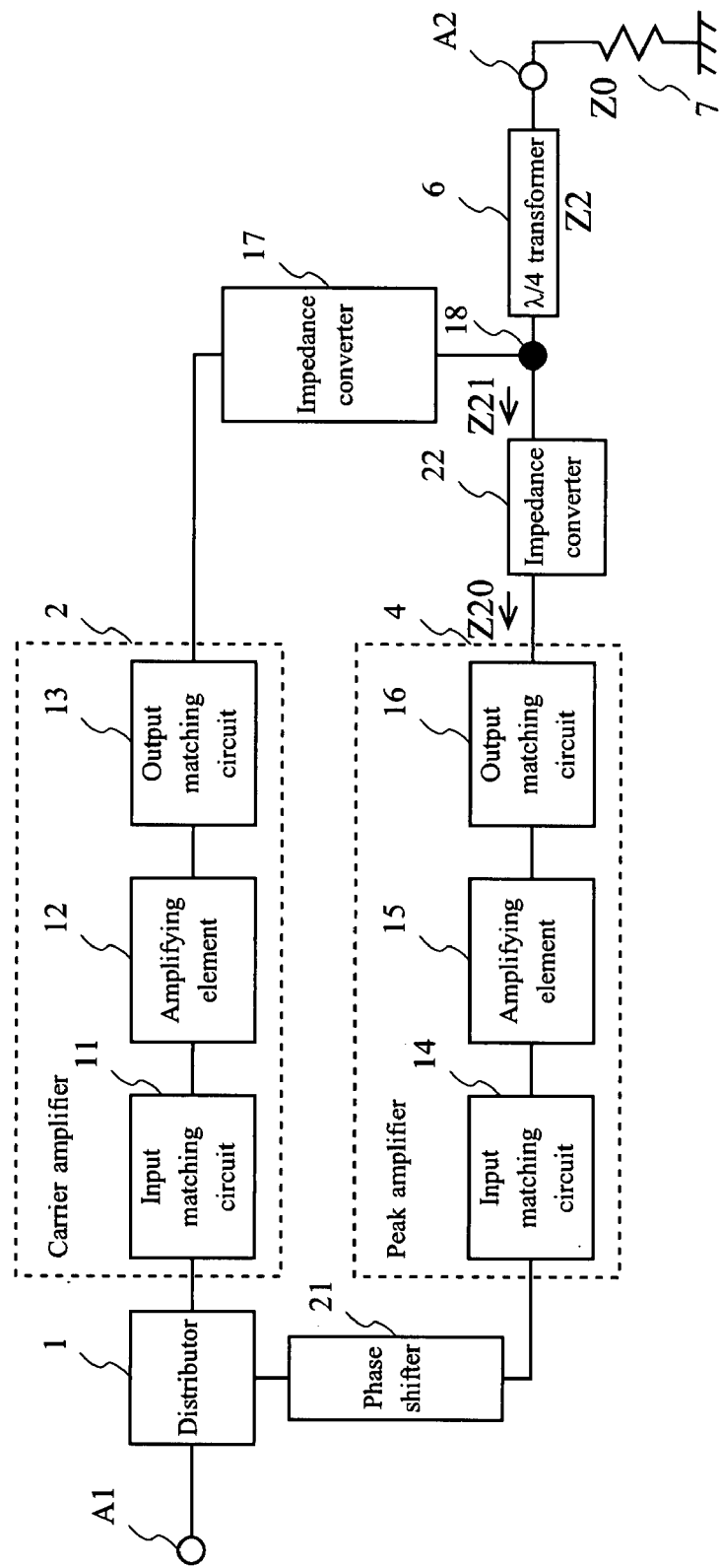
FIG. 5 illustrates an example of configuration of the amplifying system according to a second embodiment of the present invention.

FIG. 5 shows an example of configuration of an amplifying system according to this embodiment.

The amplifying system according to this embodiment further includes an impedance converter 22 between the peak amplifier 4 and the node 18 in addition to the configuration as shown in FIG. 1. In the amplifying system according to this embodiment, an amount of phase adjustment by a phase shifter 21 may be different from the case of the amplifying system shown in FIG. 1. In the amplifying system according to this embodiment, the components represented by the same reference numerals as those shown in FIG. 1 are basically the same except for data.

The impedance converter 22 in this embodiment is composed of a transmission line, and an impedance Z20 of the transmission line with respect to the output matching circuit 16 side of the peak amplifier 4 is converted to a large extent to an impedance Z21 of the node 18 with respect to the output matching circuit 16 of the peak amplifier 4 so that the signal does not flow toward the peak amplifier 4 when the amplifying element 15 of the peak amplifier 4 is not operated since the input level is low.

The phase shifter 21 generates a phase amount different from the phase shifter 3 in FIG. 1 since the impedance converter 22 is provided. The phase shifter 21 may be provided on a path of the carrier amplifier 4 when the phase amounts of the carrier amplifier 2 and the peak amplifier 4 are significantly different. The phase shifter 21 in this embodiment is used as a phase adjustment circuit for avoiding an influence of the impedance converter (transmission line) 22, and may also be used as the phase adjustment circuit when the phase of the circuit system of the carrier amplifier 2 and the phase of the circuit system of the peak amplifier 4 are different.

As described above, in the amplifying system according to this embodiment, the impedance converter (transmission line) 22 is inserted between the output matching circuit 16 and the combining point (node 18) in contrast to the output matching circuit 16 to be inserted between the amplifying element 15 of the second amplifying circuit (the peak amplifier 4 in this embodiment) and the combining point of the amplifying element 15.

For example, in the Doherty amplifier in the related art, the output impedance of the output matching circuit of the peak amplifier is not increased sufficiently when the input level is low, and hence may cause a loss of the carrier amplifier. In contrast, in the amplifying system in this embodiment, the impedance of the combining point (node 18) with respect to the output matching circuit 16 may be set to a larger value (Z21 in this embodiment) even in the configuration in which the output matching circuit 16 of the normal peak amplifier 4 is used, the loss of the carrier amplifier 2 is retrained. In this case, the value of Z21 does not necessarily have to be the maximum value, and the performance may be improved by maintaining Z21 at a large value to some extent by adjusting the electric length of the impedance converter 22 and changing the load impedance in Section B.

The first embodiment shown above corresponds to a case in which the impedance converter 22 in this embodiment is set to an electric length of zero.

Third Embodiment

A third embodiment of the present invention will be described.

Figure 11:
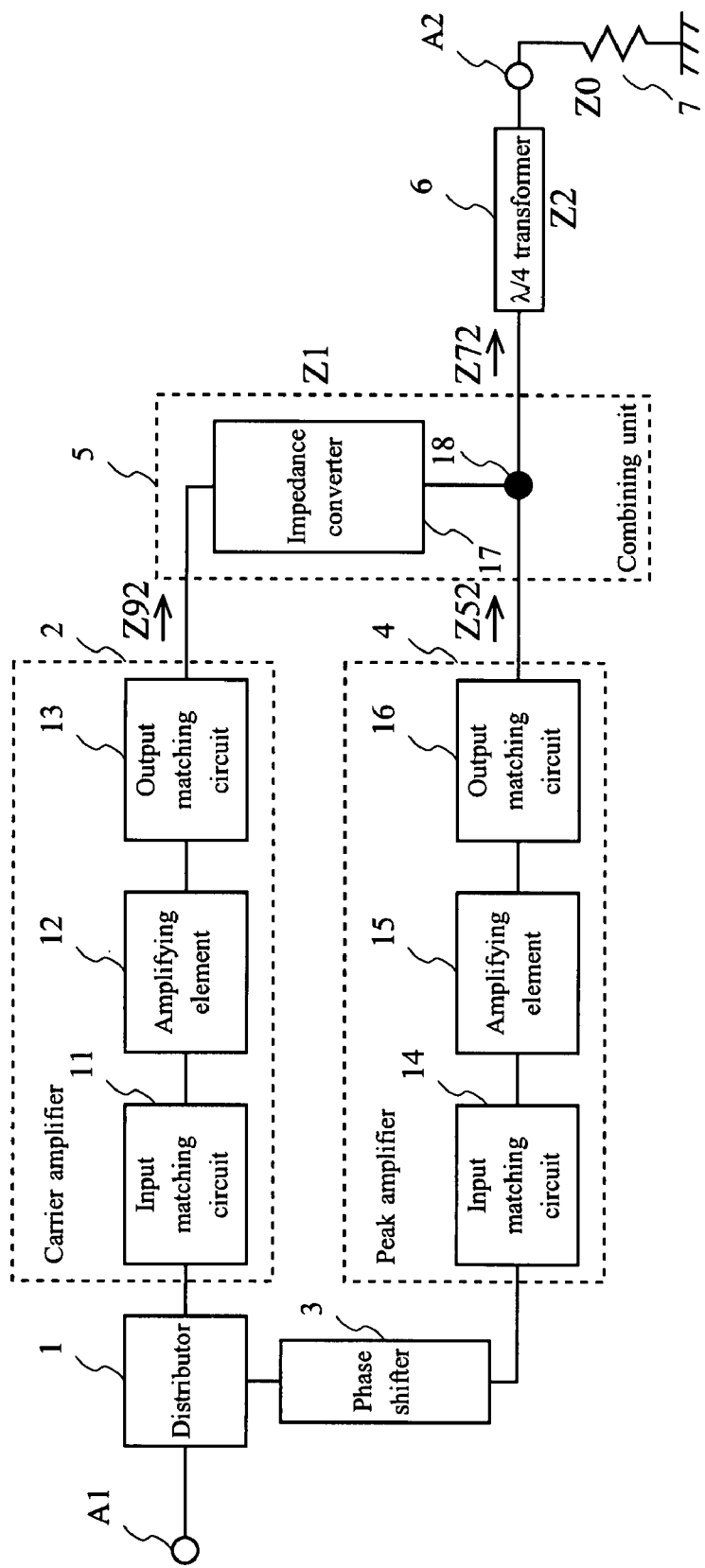
FIG. 11 illustrates an example of configuration of the amplifying system according to a third embodiment of the present invention.

FIG. 11 shows an example of configuration of an amplifying system according to this embodiment.

It is basically the same as the configuration in FIG. 1, and a load impedance Z92 of the carrier amplifier 2, a load impedance Z52 in the peak amplifier 4, and an impedance Z72 of the node 18 are changed.

Therefore, the impedance Z72 of the node 18 is determined by factorizing into loads on the carrier amplifier 2 side and the peak amplifier 4 side as expressed in formula (5).

$$[\text{Expression 5}] \tag{5}$$

| For the carrier amplifier | |
|---|---|
| parallel with $2(Z7)$ and $2(Z7) \cdot \alpha$ | Section A |
| $2(Z7)$ | Section C |
| For the peak amplifier | |
| $\infty$ | Section A |
| $2(Z7) \cdot \alpha$ | Section C |

That is, the load impedance which generates the maximum output of the carrier amplifier 2 is set to $2(Z7)$ and the load impedance which generates the maximum output of the peak amplifier 4 is set to $2(Z7) \cdot \alpha$.

Figure 12:
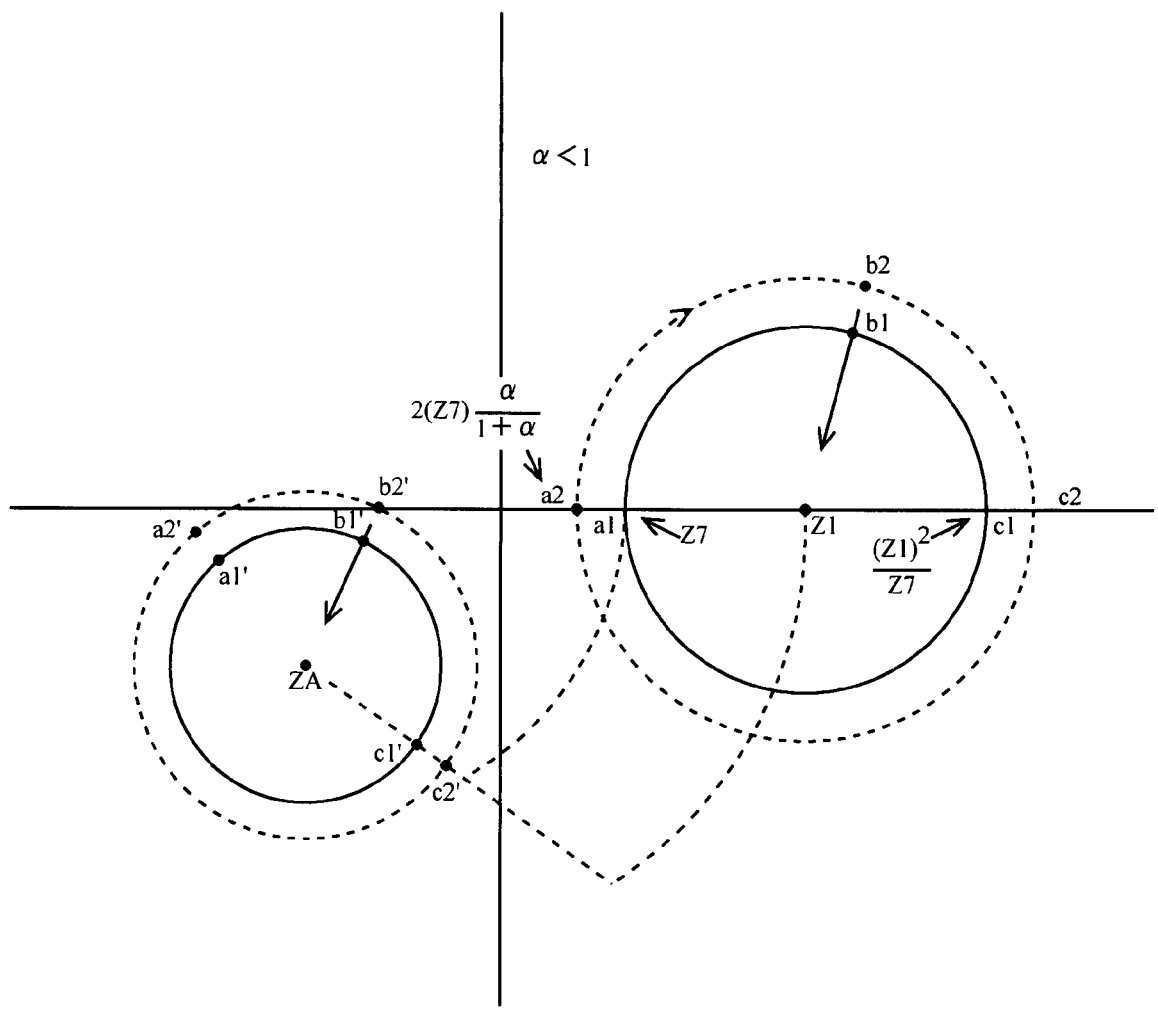
FIG. 12 is a Smith Chart showing an example of matching in the carrier amplifier with the output matching circuit and the impedance converter in a case in which α is smaller than 1.

FIG. 12 is a Smith chart showing an example of matching with the output matching circuit 13 of the carrier amplifier 2 and the impedance converter 17.

In the case of $\alpha=1$, it is the same as the solid line in FIG. 3 and hence description is omitted.

A case of $\alpha<1$ will be described.

The fact that Pm is outputted when the load Z9 of the output matching circuit 13 is Z1 (the maximum output is achieved independently as the carrier amplifier 2) is the same.

A trajectory obtained in the case of a<1 is shown by broken line in FIG. 12.

Z92 in Section A is $\{2(Z7) \cdot \alpha/(1+\alpha)\}$, which is smaller than Z7 when the length indicated by a point a2 is $L=0$ or $\lambda/2$, and is $[(Z1)\ 2/\{2(Z7) \cdot \alpha/(1+\alpha)\}]$ when the length indicated by a point c2 is $L=\lambda/4$. When the length L of the transmission line (impedance converter 17) is changed to a range from 0 to $\lambda/2$, Z92 changes clockwise on a circle larger than the circle in the case of $\alpha=1$ with the center at Z1 (that is, on the larger circle).

The impedance on the circle with the center at Z1 is mapped on substantially a circle with the center at ZA by the output matching circuit 13 of the carrier amplifier 2. The point a2, a point b2 and the point c2 correspond to a point a2', a point b2' and a point c2', and it shows that the impedance is changed from the point a2', the point b2' and the point c2' when the length L is changed. Therefore, when the point b2' demonstrates the most superior performance, the length L at that time may be employed.

The impedance Z92 of the output matching circuit 13 of the carrier amplifier 2 in Section C is such that the load impedance is 2(Z7)=Z1, and the impedance of the amplifying element is ZA.

When the input level is increased and hence is moved from Section A to Section C, the load impedance of the amplifying element 12 of the carrier amplifier 2 is moved from b2' to ZA.

When there is no preferable matching point on the points a1'-b1'-c1'-a1' or on the points a2'-b2'-c2'-a2', the length of the broken line in FIG. 12 may be increased or decreased by changing the value $\alpha$ to change the impedance at the combining point, so that the optimal point is obtained.

The voltages of the load impedance 2Z7 of the node 18 for the carrier amplifier and the load impedance 2$\alpha$Z7 of the node 18 for the peak amplifier are the same, and hence a large amount of output is required for the peak amplifier. However, the output level is slightly increased by increasing the supply voltage of the peak amplifier and by increasing the input, so that the maximum output higher than $\alpha$=1 may be obtained.

When slight lowering of the output in comparison with the case of the combined output at the time of $\alpha$=1 is accepted, the supply voltage is not necessary to change. It is not a problem even when the output of the amplifying element is close to the saturated output, since the output is increased by increasing the input.

In this case, the load impedance of the peak amplifier is transferred from the infinity to 2$\alpha$Z7 (smaller than 2Z7) via 2Z7, matching to 2$\alpha$Z7 is performed.

The maximum output of general power amplifying elements is proportional to a supplied voltage, it is realized easily. In particular, the efficiency near a point where the frequency of amplification is high (for example, near b2') is significantly improved.

A case of $\alpha$>1 will now be described.

The fact that Pm is outputted when the load Z9 of the output matching circuit 13 is Z1 (the maximum output is achieved independently as the carrier amplifier 2) is the same.

Figure 13:
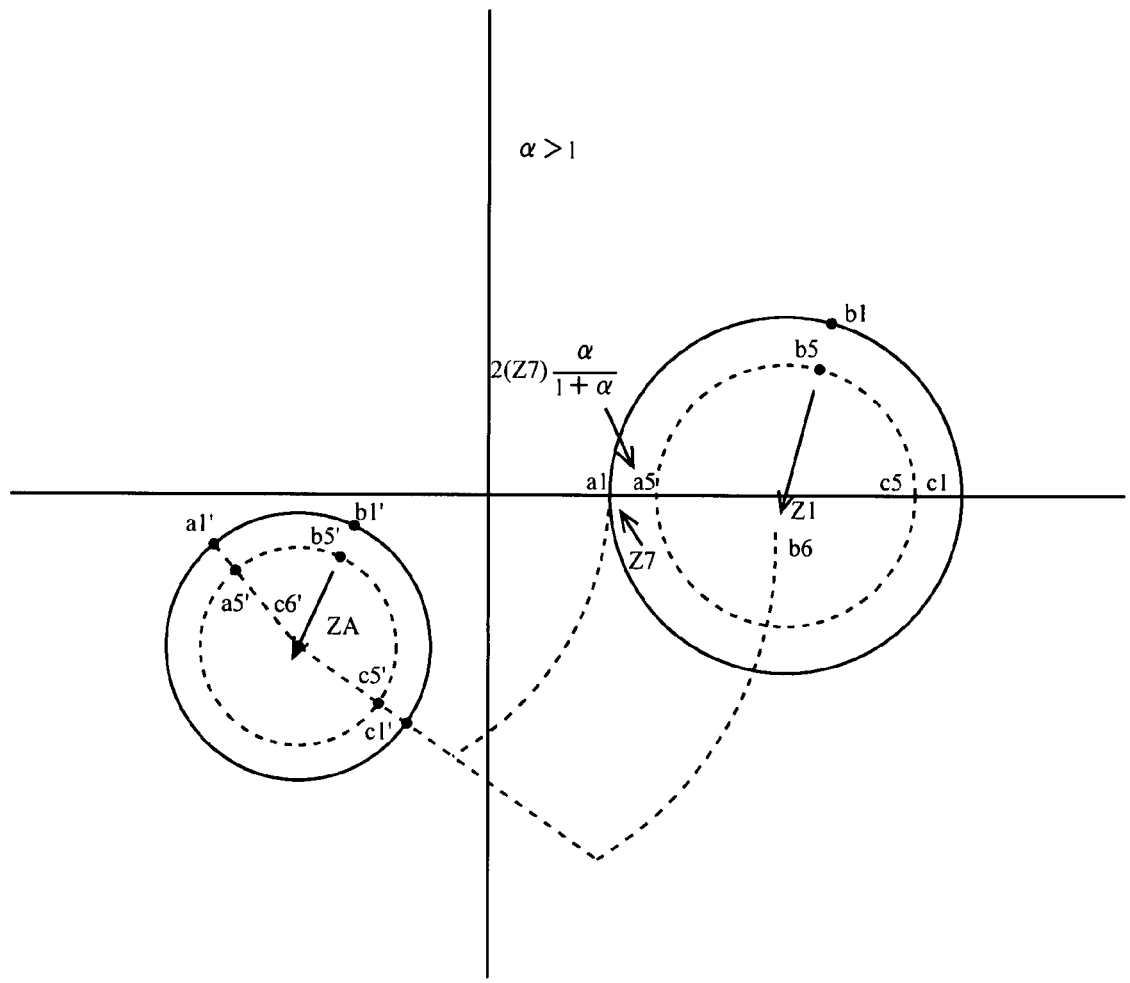
FIG. 13 is a Smith Chart showing an example of matching in the carrier amplifier with the output matching circuit and the impedance converter in a case in which α is larger than 1.

FIG. 13 is a Smith Chart showing an example of matching by the output matching circuit 13 of the carrier amplifier 2 and the impedance converter 17.

A trajectory obtained in the case of $\alpha$>1 is shown by broken lines in FIG. 13.

Z92 in Section A is $\{2(Z7)\cdot\alpha/(1+\alpha)\}$, which is larger than Z7 when the length indicated by a point a5 is L=0 or $\lambda$/2, and is $[(Z1)^2/\{2(Z7)\cdot\alpha/(1+\alpha)\}]$ when the length indicated by a point c5 is L=$\lambda$/4. When the length L of the transmission line (impedance converter 17) is changed to a range from 0 to $\lambda$/2, Z92 changes clockwise on a circle smaller than the circle in the case of $\alpha$=1 with the center at Z1 (that is, on the smaller circle).

The impedance on the circle with the center at Z1 is mapped on substantially a circle with the center at ZA by the output matching circuit 13 of the carrier amplifier 2. The point a5, a point b5 and the point c5 correspond to a point a5', a point b5' and a point c5', and it shows that the impedance is changed from the point a5', the point b5' and the point c5' when the length L is changed. Therefore, when the point b5' demonstrates the most superior performance, the length L at that time may be employed.

The impedance Z92 of the output matching circuit 13 of the carrier amplifier 2 in Section C is such that the load impedance is 2(Z7)=Z1.

When the input level is increased and hence is moved from Section A to Section C, the load impedance of the amplifying element 12 of the carrier amplifier 2 is moved from the point b5' to ZA.

In other words, the optimal point is obtained by changing a to change the diameter of the broken line.

The voltages of the load impedance 2Z7 of the node 18 for the carrier amplifier and the load impedance 2$\alpha$Z7 of the node 18 for the peak amplifier are the same, and hence the output of the peak amplifier is lowered and thus the combined output is lowered. However, the output level is slightly increased by further increasing the supply voltage of the carrier amplifier and by increasing the input, so that the maximum output higher than $\alpha$=1 is obtained.

When slight lowering of the output in comparison with the combined output the case of $\alpha$=1 is accepted, the supply voltage is not necessary to change. It is not a problem even when the output of the amplifying element is close to the saturated output, since the output is increased by increasing the input.

In this case, the load impedance of the peak amplifier is transferred from the infinity to 2$\alpha$Z7 without passing through 2Z7, matching to 2$\alpha$Z7 is performed.

The maximum output of general power amplifying elements is almost proportional to a supplied voltage, it is realized easily. In particular, the efficiency near a point where the frequency of amplification is high (for example, near b5') is significantly improved.

The length L of the transmission line (impedance converter 17) is set to the range from 0 to $\lambda$/2 in the description give above. However, it may be longer since there is a case in which the distance between the output matching circuits 13 and 16 cannot be reduced to a distance shorter than $\lambda$/2 because, for example, the amplifying elements 12 and 15 are large in practice.

In the configuration of the amplifying system in this embodiment in which the outputs from the plurality of amplifying circuits are combined and outputted as described above, the plurality of amplifying circuits include a first amplifying circuit which operates the amplifying element 12 in Class AB (the carrier amplifier 2 in this embodiment) and a second amplifying circuit which operates the amplifying element 15 in Class B or Class C (the peak amplifier 4 in this embodiment), the output from the first amplifying circuit is combined with the output from the second amplifying circuit in the transmission line (impedance converter 17) having a given electricity length, and the optimal load impedances of the respective amplifying circuits are differentiated, so that the range of load modulation of the combining point may be set as desired, and hence optimal matching is achieved in at least one of efficiency, distortion and gain (may be all) with the maximum output of the first amplifying circuit maintained as is.

The amplifying system in this embodiment is characterized, for example, in that the maximum output load impedance of the second amplifying circuit (the peak amplifier 4 in this embodiment) is different from the maximum output load impedance of the first amplifying circuit (the carrier amplifier 2 in this embodiment).

In the amplifying system according to this embodiment, for example, the maximum output load impedance of the first amplifying circuit (the carrier amplifier 2 in this embodiment) is equal to the transmission impedance of the transmission line (impedance converter 17) having a given electric length.

As a matter of course, since the load of the output terminal A2 is Z0, the impedance of Z2 is changed to achieve matching to the parallel impedance of 2(Z7) and 2(Z7)·$\alpha$.

According to the amplifying system in this embodiment, a high-efficiency amplifier with a superior performance is achieved by changing the range of the load modulation as desired by not being fixated on equalizing the maximum output load impedances of the first amplifying circuit (the carrier amplifier 2 in this embodiment) and the second amplifying circuit (the peak amplifier 4 in this embodiment), which is the characteristic of the Doherty amplifier in the related art.

In particular, the change in characteristics according to the load modulation depends on the type or the like of the amplifying element, and hence the high efficiency is achieved irrespective of the amplifying element by changing the range of the load modulation to more than double or less than double the general Doherty circuit.

The same advantages are also achieved by changing the maximum output load impedance of the output matching circuit 2 of the carrier amplifier and the impedance of the impedance transformer to $2\alpha Z7$ and by combining inversely so that the maximum output impedance of the peak amplifier 4 becomes $2Z7$.

Fourth Embodiment

A fourth embodiment of the present invention will be described.

Figure 14:
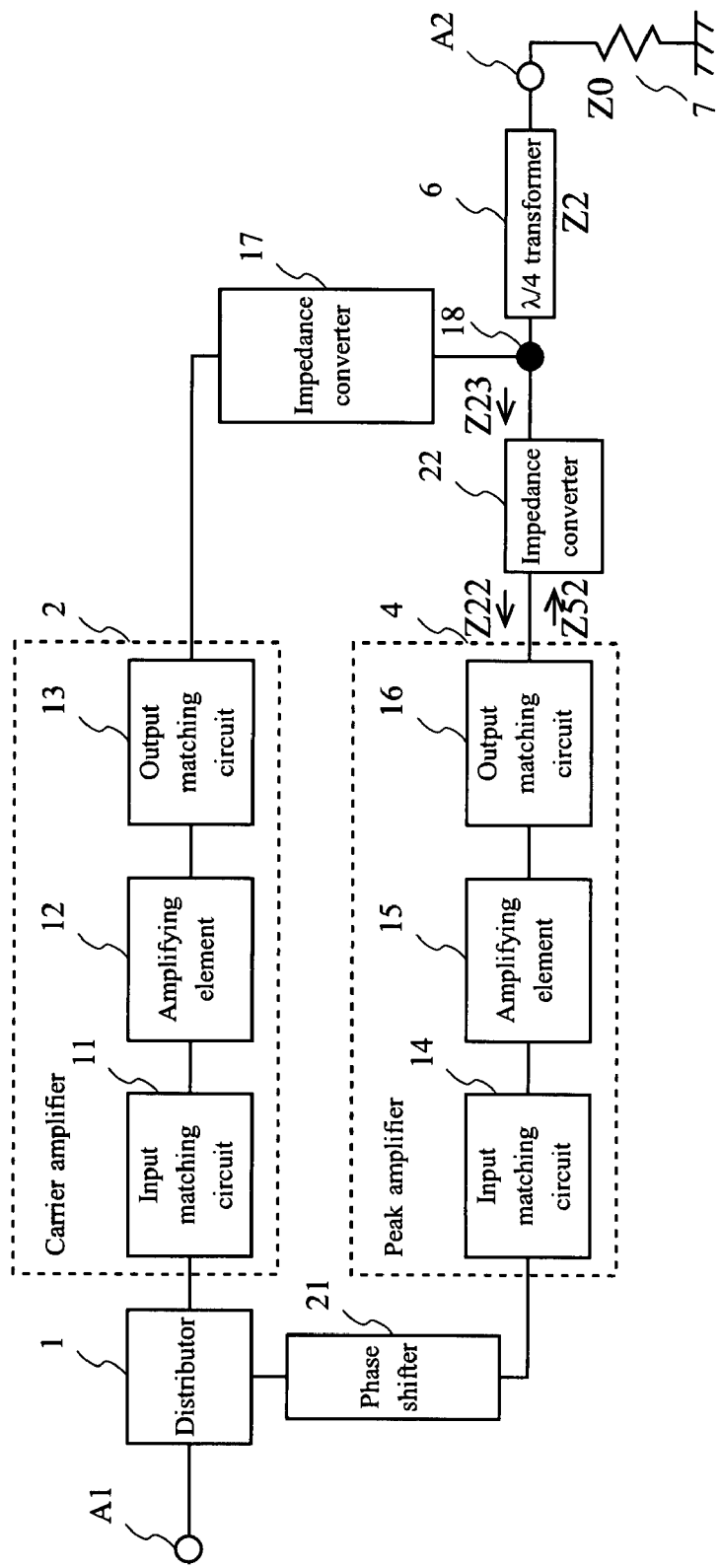
FIG. 14 illustrates an example of configuration of the amplifying system according to a fourth embodiment of the present invention.

As the configuration in FIG. 1 is improved as in FIG. 5, the configuration in FIG. 11 will be improved as in FIG. 14 in the same manner.

An impedance converter 23 in this embodiment is composed of a transmission line, and an impedance Z22 of the transmission line with respect to the output matching circuit 16 side of the peak amplifier 4 is converted to a large extent to an impedance Z23 of the node 18 with respect to the output matching circuit 16 of the peak amplifier 4 so that the signal does not flow toward the peak amplifier 4 when the amplifying element 15 of the peak amplifier 4 is not operated since the input level is low.

Fifth Embodiment

A fifth embodiment of the invention will be described.

Figure 15:
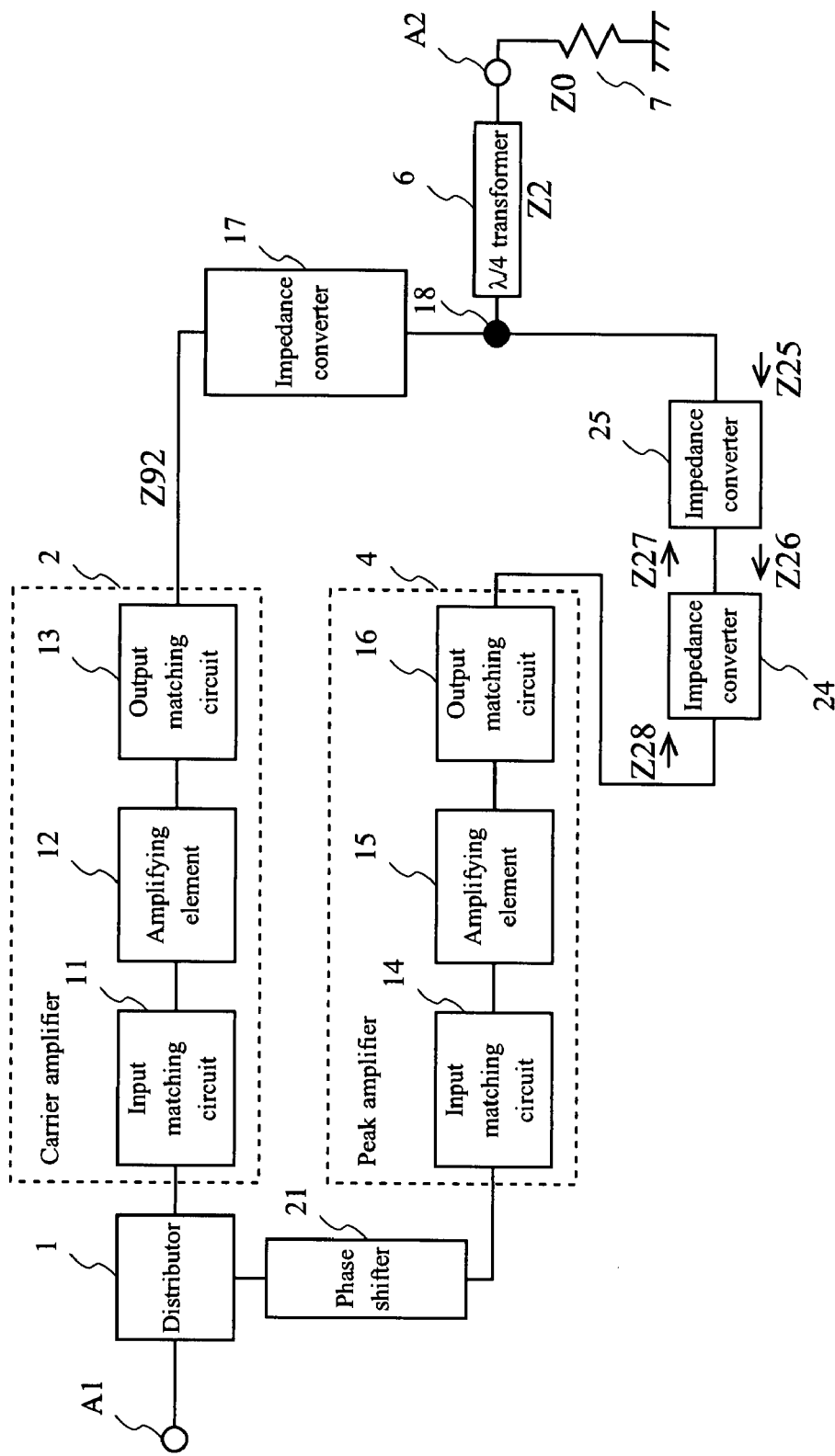
FIG. 15 illustrates an example of configuration of the amplifying system according to a fifth embodiment of the present invention.

In the examples shown in FIG. 11 and FIG. 14, the impedances which generate the maximum outputs of the carrier amplifier 2 and the peak amplifier 4 are, respectively, $2(Z7)$ (=Z1) as Z92 and $2(Z7)\cdot\alpha$ as Z52. However, since there are different from each other, the two types of the matching circuits are accommodated at the time of development and the adjustment, and hence the possibility of low productivity remains. Therefore, a better working property is achieved by equalizing the load impedances of the output circuits 13 and 16 with which the maximum output load impedance is obtained and converting the load impedances by a simple converter. Therefore, as shown in FIG. 15, an impedance Z28 with which the maximum output is obtained from the output matching circuit of the peak amplifier 4 is set to $2(Z7)$, which is equal to Z92, and Z27 is converted to $2(Z7)\cdot\alpha$ by an impedance converter 24. That is, the impedance Z28 (=Z92=$2(Z7)$) with which the maximum output is obtained from the output matching circuit of the peak amplifier 4 is converted to a different value Z27 (=$2(Z7)\cdot\alpha$) by the impedance converter 24.

A $\lambda/4$ line may be used as the impedance converter 24, or other methods may be employed as long as the impedance can be converted.

Since an impedance converter 25 is $2(Z7)\cdot\alpha$, the impedance of $2(Z7)\cdot\alpha$ is maintained to the node 18. That is, the maximum output of Section can be transmitted. In Section A having less signal input, Z26 is converted to a larger impedance Z25 by the impedance converter 25.

Other operations are the same as those in the first embodiment.

The amount of transfer of the phase shifter 21 is changed in order to adjust a delay or a phase relation. It may be inserted on the carrier amplifier side.

Sixth Embodiment

A sixth embodiment of the present invention will be described.

Figure 6:
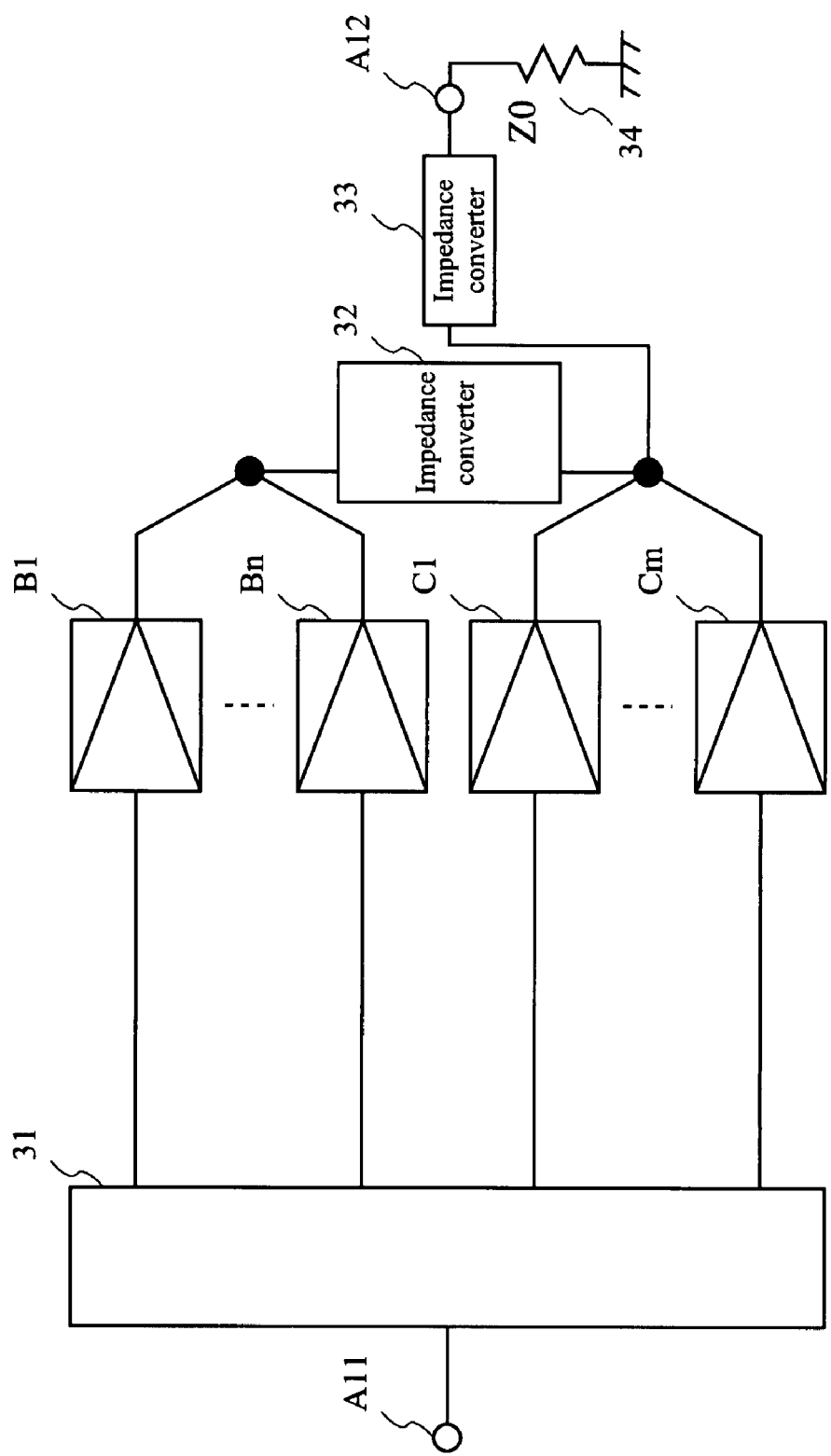
FIG. 6 illustrates an example of configuration of the amplifying system according to a sixth embodiment of the present invention.

An example of the configuration of the amplifying system according to this embodiment is shown in FIG. 6.

The amplifying system in this embodiment includes an input terminal A11, a distributor 31, n (plural) pieces of carrier amplifiers B1 to Bn, m (plural) pieces of peak amplifiers C1 to Cm, an impedance converter 32 for connecting the output from the n pieces of carrier amplifiers B1 to Bn and the output from the m pieces of carrier amplifiers C1 to Cm, an impedance converter 33 on the output side, an output terminal A12 and an output load 34.

The amplifying system in this embodiment is preferable, for example, in a case in which the output level is not sufficient only with the two amplifying circuits as in FIG. 1, FIG. 5, FIG. 11 FIG. 14 and FIG. 15, in which a plurality of the carrier amplifiers B1 to Bn are arranged in parallel and a plurality of the peak amplifiers C1 to Cm are arranged in parallel to achieve matching as in FIG. 3 and FIG. 4 or in FIG. 12 and FIG. 13. Other examples of configuration include a configuration in which one piece of one of the carrier amplifier and the peak amplifier, and a plurality of the other one of those is also applicable.

Alternatively, a configuration in which the phase shifter 3 or 21 as shown in FIG. 1, FIG. 5, FIG. 11, FIG. 14 and FIG. 15 is provided, or a configuration in which the impedance converter 22, 23, 24 or 25 on the output side of the peak amplifier 4 as shown in FIG. 5, FIG. 14 and FIG. 15 is provided is also applicable.

An example of operation performed by the amplifying system according to this embodiment will be shown.

An input signal to the amplifying system in this embodiment is supplied to the input terminal A11.

The distributor 31 distributes a signal supplied from the input terminal A11 into (n+m) parts. The respective distributed signals are supplied to the respective carrier amplifiers B1 to Bn and the respective peak amplifiers C1 to Cm.

The respective carrier amplifiers B1 to Bn, for example, have a function similar to the carrier amplifier 2 shown in FIG. 1, and the outputs from the n pieces of carrier amplifiers B1 to Bn are combined and supplied to the impedance converter 32.

The respective peak amplifiers C1 to Cm have a configuration similar to the peak amplifier 4 shown in FIG. 1, and the outputs from the m pieces of the peak amplifiers C1 to Cm are combined together, which is combined with the output from the impedance converter 32. The combined signal is outputted from the output terminal A12 via the impedance converter 33 on the output side.

The impedance converter 33 on the output side is composed, for example, of a $\lambda/4$ transformer, and converts the impedance of the combining point (node) on the output side of the peak amplifiers C1 to Cm to Z0, which corresponds to the output load 34.

As described above, in the amplifying system according to this embodiment, the input signal is distributed into (n+m) parts by the distributor 31, and the n distributed signals are amplified by the amplifiers (the carrier amplifiers B1 to Bn in this embodiment) in Class AB which operate with small signals input to large signals input, and m distributed signals are amplified by the amplifiers (the peak amplifiers C1 to Cm in this embodiment) in Class B or Class C which operate with large signal input.

The m pieces of peak amplifiers C1 to Cm may be of those which start operation from the same input level, or of those having different bias levels and start operation gradually in sequence according to increase in the input level.

Seventh Embodiment

A seventh embodiment of the present invention will be described.

Figure 7:
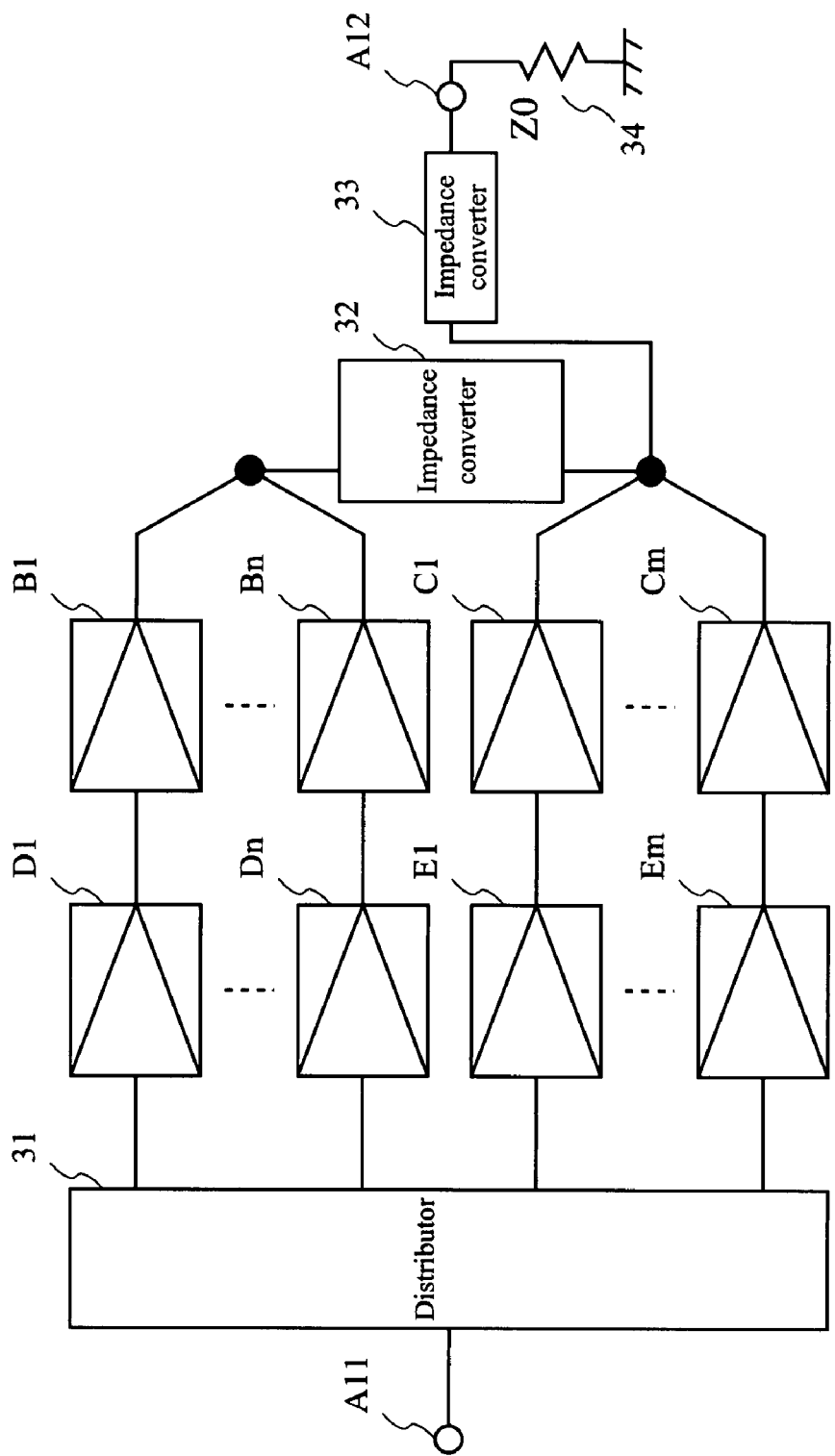
FIG. 7 illustrates an example of configuration of the amplifying system according to a seventh embodiment of the present invention.

FIG. 7 shows a configuration of an amplifying system according to this embodiment.

The amplifying system in this embodiment further includes amplifiers (preamplifiers) D1 to Dn which operate in Class AB inserted between the distributor 31 and the respective carrier amplifiers B1 to Bn, and amplifiers (preamplifiers) E1 to Em which operate in Class AB, Class B or Class C between the distributor 31 and the respective peak amplifiers C1 to Cm. In this manner, in the amplifying system in this embodiment, the preamplifiers D1 to Dn and E1 to Em are secondarily connected upstream respectively of the carrier amplifiers B1 to Bn and the peak amplifiers C1 to Cm.

In general, the amplifier uses a plurality of amplifying elements in order to obtain a required gain. For example, a preamplifier is connected secondarily to the amplifying system as shown in FIG. 1, FIG. 2, FIG. 5, FIG. 11, FIG. 14 and FIG. 15. However, there exists the distributor 1 in the circuit of the amplifying system such as those shown above, and electric power distributed to the peak amplifier 4 is not effectively used but reflected in Section A where the peak amplifier 4 does not operate. In other word, even though the signal amplified in the preamplifier is supplied from the input terminal A1 of the amplifying system such as those shown in FIG. 1, FIG. 2, FIG. 5, FIG. 11, FIG. 14 and FIG. 15, the supplied electricity is resulted in distribution loss. This distribution loss lowers the additive source efficiency of the Doherty amplifier.

In contrast, the amplifying system in this embodiment is preferable since the source efficiency is improved.

The respective preamplifiers D1 to Dn and E1 to Em are provided an input matching circuit and an output matching circuit as needed. These preamplifiers D1 to Dn and E1 to Em may all have the same configuration, or may have different operation classes. For example, a plurality of the preamplifiers may be connected in cascade. Alternatively, for example, a plurality of the preamplifiers may be combined into one unit and used in common such as a configuration in which all the preamplifiers D1 to Dn for the carrier amplifiers B1 to Bn are combined into one unit, or a configuration in which all the preamplifiers E1 to Em for the peak amplifiers C1 to Cm are combined into one unit.

In this embodiment, the configuration in which the amplifying system is provided further with the preamplifiers D1 to Dn and E1 to Em as shown in FIG. 6 has been described. However, for example, a configuration in which the preamplifier is provided between the distributor 1 and the carrier amplifier 2, or a configuration in which the preamplifier is provided between the distributor 1 and the phase shifters 3, 21 or between the phase shifters 3, 21 and the peak amplifier 4 is also applicable to the amplifying system such as those shown in FIG. 1, FIG. 2, FIG. 5, FIG. 11, FIG. 14 and FIG. 15.

As described thus far, according to the amplifying system in this embodiment, in the configuration including the distributor 31 that distributes the input signal to the amplifying system into a plurality of parts, the first amplifying circuit (the plurality of carrier amplifiers B1 to Bn in this embodiment), and the second amplifying circuit (the plurality of peak amplifiers C1 to Cm in this embodiment), there are further provided the first preamplifiers that amplify the outputs from the distributor 31 in Class AB (the plurality of preamplifiers D1 to Dn in this embodiment) and output the same to the first amplifying circuits and the second preamplifiers that amplify the outputs from the distributor 31 in Class AB, Class B or Class C and output the same to the second amplifying circuits (the plurality of preamplifiers E1 to Em in this embodiment).

According to the amplifying system in this embodiment, for example, the input signal is distributed by the distributor 31 when the input signal is still at a low level. Therefore, the distribution loss is small and, consequently, the source efficiency of the entire amplifying system is improved. This advantage is remarkable, for example, when the gains of the amplifying elements of the carrier amplifiers B1 to Bn are small.

The configuration of the amplifying system of the present invention is not limited to those shown above, and the present invention may be applied to various fields.

INDUSTRIAL APPLICABILITY

As described thus far, the amplifying system in the present invention includes a function to distribute a signal, the carrier amplifier that amplifies the distributed first signal in Class AB, the peak amplifier that amplifies the distributed second signal in Class B or Class C, the first transmission line having a given electric length and being connected to the output of the carrier amplifier, the second transmission line having a given electric length and being connected to the output of the peak amplifier, and the combining end for combining the output from the first transmission line and the output from the second transmission line, and the impedance of the combining end is set to a value different from the parallel impedance of the load impedances of the carrier amplifier and the peak amplifier converted respectively by the first transmission line and the second transmission line at the maximum power, which is the value at which the performance is improved. Therefore, the performance is improved by achieving adequate matching in comparison, for example, with the Doherty amplifier in the relate art.

The combining end impedance may be determined by combining the load impedances of the carrier amplifier and the peak amplifier at the maximum power, which are different from each other, so that the range of load modulation of the carrier amplifier can be set as desired. Therefore, the performance is improved.

According to the amplifying system in the present invention, the first amplifying circuit on the carrier amplifier side includes the first preamplifier which operates in Class AB, and the second amplifying circuit on the peak amplifier side includes the second preamplifier which operates at any one of Class A to Class C. Therefore, the efficiency is further improved.

The invention claimed is:

1. An amplifying system for amplifying a signal comprising:
   distributing means that distributes the signal;
   a carrier amplifier that amplifies a distributed first signal in Class AB;
   a peak amplifier that amplifies a distributed second signal in Class B or Class C;
   a first transmission line having a given electric length, the first transmission line being connected to an output of the carrier amplifier;

a second transmission line having a given electric length, the second transmission line being connected to an output of the peak amplifier; and a combining end that combines an output of the first transmission line and an output of the second transmission line, wherein an impedance at the combining end is set to be different from a parallel impedance of load impedances of the carrier amplifier and the peak amplifier converted respectively by the first transmission line and the second transmission line at a maximum power, a first amplifying circuit on the carrier amplifier side includes a first preamplifier which operates in Class AB, and a second amplifying circuit on the peak amplifier side includes a second preamplifier which operates in any one of Class A to Class C.

2. An amplifying system for amplifying a signal comprising:

distributing means that distributes the signal, a carrier amplifier that amplifies a distributed first signal in Class AB;

a peak amplifier that amplifies a distributed second signal in Class B or Class C;

a first transmission line having a given electric length, the first transmission line being connected to an output of the carrier amplifier;

a second transmission line having a given electric length, the second transmission line being connected to an output of the peak amplifier; and a combining end that combines an output of the first transmission line and an output of the second transmission line, wherein load impedances of the carrier amplifier and the peak amplifier at a maximum power are differentiated, and an impedance of the combining, end is equalized to a parallel impedance of the load impedances of the carrier amplifier and the peak amplifier at the maximum power, a first amplifying circuit on the carrier amplifier side includes a first preamplifier which operates in Class AB, and a second amplifying circuit on the peak amplifier side includes a second preamplifier which operates in any one of Class A to Class C.

3. An amplifying system for amplifying a signal comprising:

distributing means that distributes a signal;

a carrier amplifier that amplifies a distributed first signal in Class AB;

a peak amplifier that amplifies a distributed second signal in Class B or Class C;

a first transmission line having a given electric length, the first transmission line being connected to an output of the carrier amplifier;

a second transmission line having a given electric length, the second transmission line being connected to an output of the peak amplifier; and a combining end that combines an output of the first transmission line and an output of the second transmission line, wherein load impedances of the carrier amplifier and the peak amplifier at a maximum power are the same, an impedance converter that converts the load impedance of the peak amplifier at the maximum power into a value different from the load impedance of the carrier amplifier at the maximum power is provided between the peak amplifier and the second transmission line, and the impedance of a combining point is a parallel impedance of a maximum load impedance of the carrier amplifier and the impedance converted by the impedance converter, a first amplifying circuit on the carrier amplifier side includes a first preamplifier which operates in Class AB, and a second amplifying circuit on the peak amplifier side includes a second preamplifier which operates in any one of Class A to Class C.

* * * * *